(12) United States Patent
Salcedo

(10) Patent No.: US 9,006,782 B2
(45) Date of Patent: Apr. 14, 2015

(54) INTERFACE PROTECTION DEVICE WITH INTEGRATED SUPPLY CLAMP AND METHOD OF FORMING THE SAME

(71) Applicant: Analog Devices, Inc., Norwood, MA (US)

(72) Inventor: Javier Alejandro Salcedo, North Billerica, MA (US)

(73) Assignee: Analog Devices, Inc., Norwood, MA (US)

( * ) Notice: Subject to any disclaimer, the term of this patent is extended or adjusted under 35 U.S.C. 154(b) by 51 days.

(21) Appl. No.: 13/757,588

(22) Filed: Feb. 1, 2013

(65) Prior Publication Data

US 2014/0167106 A1 Jun. 19, 2014

Related U.S. Application Data

(62) Division of application No. 13/754,200, filed on Jan. 30, 2013.

(60) Provisional application No. 61/739,645, filed on Dec. 19, 2012.

(51) Int. Cl.
*H01L 29/66* (2006.01)
*H01L 27/092* (2006.01)
(Continued)

(52) U.S. Cl.
CPC ......... *H01L 29/66378* (2013.01); *H01L 27/092* (2013.01); *H01L 29/735* (2013.01); *H01L 29/861* (2013.01); *H01L 29/0692* (2013.01)

(58) Field of Classification Search
USPC .............................. 345/1.1–2.3, 903; 257/146
See application file for complete search history.

(56) References Cited

U.S. PATENT DOCUMENTS 3,436,667 A 4/1969 Kedson
4,633,283 A 12/1986 Avery
(Continued)

FOREIGN PATENT DOCUMENTS

DE 10 2007 040 875 A1 3/2009
EP 0 168 678 A2 1/1986
(Continued)

OTHER PUBLICATIONS

Chang et al., High-k Metal Gate-bounded Silicon Controlled Rectifier for ESD Protection, 34th Electrical Overstress/Electrostatic Discharge Symposium, Sep. 2012, 7 pages.
(Continued)

*Primary Examiner* — Matthew Landau
*Assistant Examiner* — Igwe U Anya
(74) *Attorney, Agent, or Firm* — Knobbe, Martens, Olson & Bear, LLP

(57) ABSTRACT

Protection circuit architectures with integrated supply clamps and methods of forming the same are provided herein. In certain implementation, an integrated circuit interface protection device includes a first diode protection structure and a first thyristor protection structure electrically connected in parallel between a signal pin a power high supply. Additionally, the protection device includes a second diode protection structure and a second thyristor protection structure electrically connected in parallel between the signal pin and a power low supply. Furthermore, the protection device includes a third diode protection structure and a third thyristor protection structure electrically connected in parallel between the power high supply and the power low supply. The third thyristor protection structure and the third diode protection structure are synthesized as part of the integrated circuit interface and can share at least a portion of the wells and/or diffusion regions associated with the first and second thyristor protection structures.

19 Claims, 27 Drawing Sheets

(51) Int. Cl.
 H01L 29/735 (2006.01)
 H01L 29/861 (2006.01)
 H01L 29/06 (2006.01)

(56) References Cited

U.S. PATENT DOCUMENTS

| | | | |
|---|---|---|---|
| 5,061,652 A | 10/1991 | Bendernagel et al. |
| 5,276,582 A | 1/1994 | Merrill et al. |
| 5,341,005 A | 8/1994 | Canclini |
| 5,343,053 A | 8/1994 | Avery |
| 5,541,801 A | 7/1996 | Lee et al. |
| 5,576,557 A * | 11/1996 | Ker et al. | 257/173 |
| 5,615,074 A | 3/1997 | Avery |
| 5,652,689 A | 7/1997 | Yuan |
| 5,663,860 A | 9/1997 | Swonger |
| 5,742,084 A | 4/1998 | Yu |
| 5,745,323 A * | 4/1998 | English et al. | 361/56 |
| 5,781,389 A | 7/1998 | Fukuzako et al. |
| 5,786,617 A | 7/1998 | Merrill et al. |
| 5,889,644 A | 3/1999 | Schoenfeld et al. |
| 5,895,840 A | 4/1999 | Ohuchi et al. |
| 5,895,940 A | 4/1999 | Kim |
| 5,998,813 A | 12/1999 | Bernier |
| 6,137,140 A | 10/2000 | Efland et al. |
| 6,144,542 A | 11/2000 | Ker et al. |
| 6,236,087 B1 | 5/2001 | Daly et al. |
| 6,258,634 B1 | 7/2001 | Wang et al. |
| 6,310,379 B1 | 10/2001 | Andresen et al. |
| 6,329,694 B1 | 12/2001 | Lee et al. |
| 6,403,992 B1 | 6/2002 | Wei |
| 6,404,261 B1 | 6/2002 | Grover et al. |
| 6,423,987 B1 | 7/2002 | Constapel et al. |
| 6,512,662 B1 | 1/2003 | Wang |
| 6,590,273 B2 | 7/2003 | Okawa et al. |
| 6,621,126 B2 | 9/2003 | Russ |
| 6,665,160 B2 | 12/2003 | Lin et al. |
| 6,667,870 B1 | 12/2003 | Segervall |
| 6,704,180 B2 | 3/2004 | Tyler et al. |
| 6,724,603 B2 | 4/2004 | Miller et al. |
| 6,756,834 B1 | 6/2004 | Tong et al. |
| 6,765,771 B2 | 7/2004 | Ker et al. |
| 6,768,616 B2 | 7/2004 | Mergens et al. |
| 6,870,202 B2 | 3/2005 | Oka |
| 6,960,792 B1 | 11/2005 | Nguyen |
| 6,960,811 B2 | 11/2005 | Wu et al. |
| 6,979,869 B2 | 12/2005 | Chen et al. |
| 7,034,363 B2 | 4/2006 | Chen |
| 7,038,280 B2 | 5/2006 | Righter |
| 7,071,528 B2 | 7/2006 | Ker et al. |
| 7,125,760 B1 | 10/2006 | Reese et al. |
| 7,232,705 B2 | 6/2007 | Righter |
| 7,232,711 B2 | 6/2007 | Gambino et al. |
| 7,335,543 B2 | 2/2008 | Chen et al. |
| 7,345,341 B2 | 3/2008 | Lin et al. |
| 7,385,793 B1 | 6/2008 | Ansel et al. |
| 7,436,640 B2 | 10/2008 | Su et al. |
| 7,566,914 B2 | 7/2009 | Salcedo et al. |
| 7,570,467 B2 | 8/2009 | Watanabe et al. |
| 7,601,991 B2 | 10/2009 | Salcedo et al. |
| 7,663,190 B2 | 2/2010 | Vinson |
| 7,714,357 B2 | 5/2010 | Hayashi et al. |
| 7,834,378 B2 | 11/2010 | Ryu et al. |
| 7,910,999 B2 | 3/2011 | Lee et al. |
| 7,969,006 B2 | 6/2011 | Lin et al. |
| 8,044,457 B2 | 10/2011 | Salcedo et al. |
| 8,198,651 B2 | 6/2012 | Langguth et al. |
| 8,222,698 B2 | 7/2012 | Salcedo et al. |
| 8,331,069 B2 | 12/2012 | Galy et al. |
| 8,368,116 B2 | 2/2013 | Salcedo et al. |
| 8,416,543 B2 | 4/2013 | Salcedo |
| 8,432,651 B2 | 4/2013 | Salcedo et al. |
| 8,466,489 B2 | 6/2013 | Salcedo et al. |
| 8,553,380 B2 | 10/2013 | Salcedo |
| 8,592,860 B2 | 11/2013 | Salcedo et al. |
| 8,610,251 B1 | 12/2013 | Salcedo |
| 8,633,509 B2 | 1/2014 | Salcedo et al. |
| 8,637,899 B2 | 1/2014 | Salcedo |
| 8,665,571 B2 | 3/2014 | Salcedo et al. |
| 8,680,620 B2 | 3/2014 | Salcedo et al. |
| 8,772,091 B2 | 7/2014 | Salcedo et al. |
| 8,796,729 B2 | 8/2014 | Clarke et al. |
| 2001/0040254 A1 | 11/2001 | Takiguchi |
| 2002/0021538 A1 | 2/2002 | Chen et al. |
| 2002/0081783 A1* | 6/2002 | Lee et al. | 438/133 |
| 2002/0109190 A1 | 8/2002 | Ker et al. |
| 2002/0122280 A1 | 9/2002 | Ker et al. |
| 2002/0187601 A1 | 12/2002 | Lee et al. |
| 2003/0038298 A1* | 2/2003 | Cheng et al. | 257/107 |
| 2003/0076636 A1 | 4/2003 | Ker et al. |
| 2004/0135229 A1 | 7/2004 | Sasahara |
| 2004/0164354 A1 | 8/2004 | Mergens et al. |
| 2004/0190208 A1 | 9/2004 | Levit |
| 2004/0207021 A1 | 10/2004 | Russ et al. |
| 2004/0240128 A1 | 12/2004 | Boselli et al. |
| 2005/0012155 A1 | 1/2005 | Ker et al. |
| 2005/0082618 A1 | 4/2005 | Wu et al. |
| 2005/0087807 A1 | 4/2005 | Righter |
| 2005/0088794 A1 | 4/2005 | Boerstler et al. |
| 2005/0093069 A1 | 5/2005 | Logie |
| 2005/0151160 A1 | 7/2005 | Salcedo et al. |
| 2005/0195540 A1 | 9/2005 | Streibl et al. |
| 2006/0033163 A1 | 2/2006 | Chen |
| 2006/0109595 A1 | 5/2006 | Watanabe et al. |
| 2006/0145260 A1 | 7/2006 | Kim |
| 2006/0186467 A1 | 8/2006 | Pendharkar et al. |
| 2007/0007545 A1 | 1/2007 | Salcedo et al. |
| 2007/0058307 A1 | 3/2007 | Mergens et al. |
| 2007/0158748 A1 | 7/2007 | Chu et al. |
| 2008/0044955 A1 | 2/2008 | Salcedo et al. |
| 2008/0067601 A1 | 3/2008 | Chen |
| 2009/0032838 A1 | 2/2009 | Tseng et al. |
| 2009/0034137 A1 | 2/2009 | Disney et al. |
| 2009/0045457 A1 | 2/2009 | Bodbe |
| 2009/0057715 A1 | 3/2009 | Ryu et al. |
| 2009/0206376 A1 | 8/2009 | Mite et al. |
| 2009/0230426 A1 | 9/2009 | Carpenter et al. |
| 2009/0236631 A1 | 9/2009 | Chen et al. |
| 2009/0309128 A1 | 12/2009 | Salcedo et al. |
| 2010/0133583 A1 | 6/2010 | Mawatari et al. |
| 2010/0163973 A1 | 7/2010 | Nakamura et al. |
| 2010/0327343 A1 | 12/2010 | Salcedo et al. |
| 2011/0101444 A1 | 5/2011 | Coyne et al. |
| 2011/0110004 A1 | 5/2011 | Maier |
| 2011/0176244 A1 | 7/2011 | Gendron et al. |
| 2011/0284922 A1 | 11/2011 | Salcedo et al. |
| 2011/0303947 A1 | 12/2011 | Salcedo et al. |
| 2011/0304944 A1 | 12/2011 | Salcedo et al. |
| 2012/0007207 A1 | 1/2012 | Salcedo |
| 2012/0008242 A1 | 1/2012 | Salcedo |
| 2012/0199874 A1 | 8/2012 | Salcedo et al. |
| 2012/0205714 A1 | 8/2012 | Salcedo et al. |
| 2012/0293904 A1 | 11/2012 | Salcedo et al. |
| 2013/0032882 A1 | 2/2013 | Salcedo et al. |
| 2013/0208385 A1 | 8/2013 | Salcedo et al. |
| 2013/0234209 A1 | 9/2013 | Parthasarathy et al. |
| 2013/0242448 A1 | 9/2013 | Salcedo |
| 2013/0270605 A1 | 10/2013 | Salcedo et al. |
| 2013/0330884 A1 | 12/2013 | Salcedo et al. |
| 2014/0138735 A1 | 5/2014 | Clarke et al. |
| 2014/0167104 A1 | 6/2014 | Salcedo |
| 2014/0167105 A1 | 6/2014 | Salcedo et al. |
| 2014/0167106 A1 | 6/2014 | Salcedo |

FOREIGN PATENT DOCUMENTS

| | | |
|---|---|---|
| EP | 1 703 560 A2 | 9/2006 |
| KR | 10-2006-0067100 | 2/2006 |
| KR | 10-2009-0123683 | 12/2009 |
| KR | 10-2010-0003569 | 1/2010 |

OTHER PUBLICATIONS

Anderson et al., *ESD Protection under Wire Bonding Pads*, EOS/ESD Symposium 99-88, pp. 2A.4.1-2A.4.7 (1999).

(56) References Cited

OTHER PUBLICATIONS

Luh et al. *A Zener-Diode-Activated ESD Protection Circuit for Sub-Micron CMOS Processes*, Circuits and Systems, IEEE International Symposium, May 28-31, 2000, Geneva, Switzerland, 4 pages.

Salcedo et al., *Electrostatic Discharge Protection Framework for Mixed-Signal High Voltage CMOS Applications*, IEEE Xplore, downloaded Feb. 23, 2010 at 12:53 EST, 4 pages.

International Search Report and Written Opinion of the International Search Authority in PCT/US2013/03047, dated Jun. 27, 2013, 9 pages.

Salcedo et al., *On-Chip Protection for Automotive Integrated Circuits Robustness*, 2012 8th International Caribbean Conference on Devices, Circuits and Systems (ICCDCS), 5 pages, Mar. 2012.

Salcedo et al., *Bidirectional Devices for Automotive-Grade Electrostatic Discharge Applications*, IEEE Electron Device Letters, vol. 33, No. 6, Jun. 2012, 3 pages.

\* cited by examiner

US 9,006,782 B2

INTERFACE PROTECTION DEVICE WITH INTEGRATED SUPPLY CLAMP AND METHOD OF FORMING THE SAME

CROSS-REFERENCE TO RELATED APPLICATIONS

This application is a divisional application of U.S. application Ser. No. 13/754,200, filed Jan. 30, 2013, titled "INTERFACE PROTECTION DEVICE WITH INTEGRATED SUPPLY CLAMP AND METHOD OF FORMING THE SAME," which claims the benefit under 35 U.S.C. §119(e) of U.S. Provisional Patent Application No. 61/739,645, filed Dec. 19, 2012, titled "INTERFACE PROTECTION DEVICE WITH INTEGRATED SUPPLY CLAMP AND METHOD OF FORMING THE SAME," the disclosures of each of which are hereby incorporated by reference in their entireties herein.

BACKGROUND

1. Field

Embodiments of the invention relate to electronic systems, and more particularly, to protection architectures for mixed-signal integrated circuits (ICs).

2. Description of the Related Technology

Certain electronic systems can be exposed to a transient electrical event, or an electrical signal of a relatively short duration having rapidly changing voltage and high power. Transient electrical events can include, for example, electrostatic discharge (ESD) events.

Transient electrical events can damage integrated circuits (ICs) inside an electronic system due to overvoltage conditions and/or high levels of power dissipation over relatively small areas of the ICs. High power dissipation can increase IC temperature, and can lead to numerous problems, such as gate oxide punch-through, junction damage, metal damage, and surface charge accumulation. Moreover, transient electrical events can induce latch-up (in other words, inadvertent creation of a low-impedance path), thereby disrupting the functioning of the IC and potentially causing permanent damage to the IC. Thus, there is a need to provide an IC with protection from such transient electrical events, such as during IC power-up and power-down conditions.

SUMMARY

In one embodiment, an integrated circuit is provided. The integrated circuit includes a power high pin configured to receive a first supply voltage, a power low pin configured to receive a second supply voltage, and a signal pin configured to receive a signal. The integrated circuit further includes a first NPN bipolar transistor including an emitter electrically connected to the signal pin and a first PNP bipolar transistor including an emitter electrically connected to the power high pin. The first PNP bipolar transistor and the first NPN bipolar transistor are cross-coupled and configured to operate as a first thyristor protection structure between the power high pin and the signal pin. The integrated circuit further includes a second NPN bipolar transistor including an emitter electrically connected to the power low pin, a third NPN bipolar transistor including an emitter electrically connected to the power low pin, and a second PNP bipolar transistor including an emitter electrically connected to the signal pin. The second PNP bipolar transistor and the third NPN bipolar transistor are cross-coupled and configured to operate as a second thyristor protection structure between the signal pin and the power low pin. Additionally, the first PNP bipolar transistor and the second NPN bipolar transistor are cross-coupled and configured operate as a third thyristor protection structure between the power high pin and the power low pin.

In another embodiment, a method of forming an integrated circuit is provided. The method includes providing a first thyristor structure between a power high pin and a signal pin. The first thyristor structure is associated with a first NPN bipolar transistor and a first PNP bipolar transistor, and the first NPN bipolar transistor and the first PNP bipolar transistor are cross-coupled. The method further includes providing a second thyristor structure between the power high pin and the power low pin. The second thyristor structure is associated with a second NPN bipolar transistor and the first PNP bipolar transistor, and the second NPN bipolar transistor and the first PNP bipolar transistor are cross-coupled. The method further includes providing a third thyristor structure between the signal pin and a power low pin. The third thyristor structure is associated with a third NPN bipolar transistor and a second PNP bipolar transistor. The third NPN bipolar transistor and the second PNP bipolar transistor are cross coupled.

In another embodiment, an apparatus is provided. The apparatus includes a substrate, a first well region of a first type in the substrate, a second well region of the first type in the substrate adjacent the first well region, and a third well region of a second type opposite the first type. The third well region positioned in the substrate between the first and second well regions. The apparatus further includes a fourth well region of the second type positioned on a side of the first well region that is opposite the third well region. The apparatus further includes a first diffusion region of the first type in the fourth well region, a second diffusion region of the second type in the first well region, a third diffusion region of the first type in the third well region, and a fourth diffusion region of the second type in the second well region. The first diffusion region, the fourth well region, the first well region, and the second diffusion region are configured to operate as a first thyristor structure. Additionally, the third diffusion region, the third well region, the second well region, and the fourth diffusion region are configured to operate as a second thyristor structure. Furthermore, the second diffusion region, the first well region, the third well region and the third diffusion region are configured to operate as a third thyristor structure.

DETAILED DESCRIPTION OF EMBODIMENTS

Figure 1:
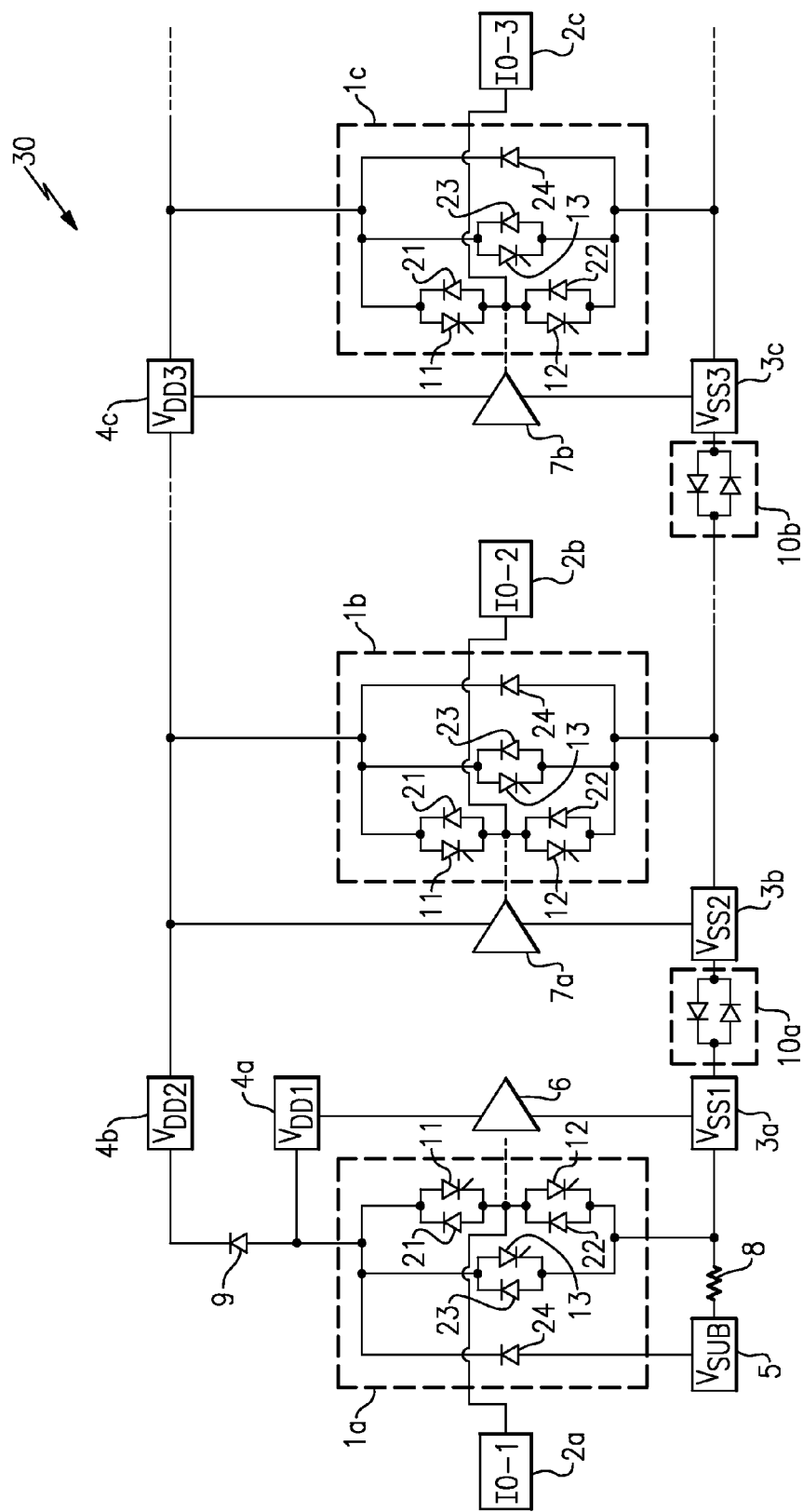
FIG. 1 is a schematic block diagram of one embodiment of an integrated circuit.

The following detailed description of embodiments presents various descriptions of specific embodiments of the invention. However, the invention can be embodied in a multitude of different ways as defined and covered by the claims. In this description, reference is made to the drawings where like reference numerals may indicate identical or functionally similar elements.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Indeed, the higher dopant concentration regions of semiconductor devices are known as diffusion regions because the dopants tend to at least be partially defined by diffusion and thus by their very nature do not have sharp boundaries. Some boundaries as shown in the accompanying figures are of this type and are illustrated as abrupt structures merely for the assistance of the reader. In the embodiments described below, p-type regions can include a semiconductor material with a p-type dopant, such as boron. Further, n-type regions can include a semiconductor material with an n-type dopant, such as phosphorous. Further, gate dielectric can include insulators, such as high k-dielectric. Further, gates can include conductive regions with variable work functions, such as variable work-function metal or polysilicon. A skilled artisan will appreciate various concentrations of dopants, conductive materials and insulating material can be used in regions described below.

Overview of Protection Devices

To help assure that an electronic system is reliable, manufacturers can test the electronic system under defined stress conditions, which can be described by standards set by various organizations, such as the Joint Electronic Device Engineering Council (JEDEC), the International Electrotechnical Commission (IEC), and the International Organization for Standardization (ISO). The standards can cover a wide multitude of transient electrical events as discussed above, including electrostatic discharge (ESD) events.

Electronic circuit reliability is enhanced by providing protection devices to the pins or pads of an IC. The protection devices can maintain the voltage level at the pins within a predefined safe range by transitioning from a high-impedance state to a low-impedance state when the voltage of the transient signal reaches a trigger voltage. Thereafter, the protection device can shunt at least a portion of the current associated with the transient signal to prevent the voltage of the transient signal from reaching a positive or negative failure voltage that is one of the most common causes of IC damage.

Certain protection schemes can use separate protection devices to protect an IC's signal pin, such as an input and/or output signal pin, and a separate power supply clamp to provide protection between the IC's power high and power low supplies.

Protection devices with integrated supply clamps and methods of forming the same are provided herein. In certain implementation, a protection device includes a first diode protection structure for protecting an IC against transient electrical events that cause the voltage of a signal pin of the IC to increase relative to the voltage of a power high supply, and a first thyristor protection structure for protecting against transient electrical events that cause the voltage of the signal pin to decrease relative to the voltage of the power high supply. Additionally, the protection device includes a second diode protection structure for protecting against transient electrical events that cause the voltage of the signal pin to decrease relative to the voltage of a power low supply, and a second thyristor protection structure for protecting against transient electrical events that cause the voltage of the signal pin to increase relative to the voltage of the power low supply. The protection device further includes an integrated supply clamp that provides protection between the IC's power high and power low supplies. The integrated supply clamp includes a third thyristor protection structure for protecting the IC when a transient electrical event causes the voltage of the power high supply to increase relative to the voltage of the power low supply, and a third diode protection structure for protecting the IC when a transient electrical event causes the voltage of the power high supply to decrease relative to the voltage of the power low supply. The third thyristor protection structure and the third diode protection structure can share at least a portion of the wells and/or diffusion regions associated with the first and second thyristor protection structures so as to enable multi-domain self-contained mixed-signal IO protection and/or reduce the protection circuit's area relative to a configuration using a supply clamp implemented in a separate layout.

The protection devices described herein can be used to enhance design flexibility by eliminating a need for separate power supply clamps between power high and power low supplies. Additionally, in some embodiments such protection devices can also alleviate a need for power supply clamps between independent power supply domains or across power supply domains in multi-supply configurations. The protection devices can aid in providing an integrated protection solution for ICs fabricated using a variety of processes, including, for example, sub-28 nm CMOS metal-gate processes.

FIG. 1 is a schematic block diagram of one embodiment of an integrated circuit 30. The integrated circuit or IC 30 includes a first protection device 1a, a second protection device 1b, a third protection device 1c, a first signal pin or pad 2a (IO-1), a second signal pin 2b (IO-2), a third signal pin 2c (IO-3), a first power low pin 3a ($V_{SS1}$), a second power low pin 3b ($V_{SS2}$), a third power low pin 3c ($V_{SS3}$), a first power high pin 4a ($V_{DD1}$), a second power high pin 4b ($V_{DD2}$), a third power high pin 4c ($V_{DD3}$), a substrate supply pin 5 ($V_{SUB}$), a receiver 6, a first transmitter or driver 7a, a second driver 7b, a resistor 8, a diode 9, a first anti-parallel diode structure 10a, and a second anti-parallel diode structure 10b.

The integrated circuit 30 illustrates one example of an integrated circuit that can include one or more of the protection devices described herein. However, the protection devices can be used in other integrated circuit configurations, including, for example, implementations of integrated circuits using more or fewer protection devices, signal pins, and/or power supply domains. For example, protection devices can be used to protect one or more signal pins of an IC that includes a single power supply domain.

The illustrated integrated circuit 30 includes independent power supply domains, or power supply domains associated with different power high and power low supply pins or pads. The independent power supply domains can be used to enhance noise isolation between different power domains and/or to permit the power supply domains to operate with different electrical potentials or voltages. For example, the integrated circuit 30 includes a first power supply domain associated with the first signal pin 2a and the first power low and power high pins 3a, 4a, a second power supply domain associated with the second signal pin 2b and the second power low and power high pins 3b, 4b, and a third power supply domain associated with the third signal pin 2c and the third power low and power high pins 3c, 4c. In one embodiment, the first power supply domain is a 0.9 V domain and at least one of the second or third power supply domains is a domain having a voltage in the range of about 1.8 V to about 3.3 V. However, other configurations are possible.

The first to third protection devices 1a-1c can be used to provide transient electrical event protection such as ESD protection to the first to third power supply domains. For example, the first protection device 1a can protect circuitry associated with the first power supply domain, such as the receiver 6, from ESD events received between the first signal pin 2a and the first power low pin 3a, between the first signal pin 2a and the first power high pin 4a, and/or between the first power low pin 3a and the first power high pin 4a. Additionally, the second protection device 1b can protect circuitry associated with the second power supply domain from ESD events received between the second signal pin 2b and the second power low pin 3b, between the second signal pin 2b and the second power high pin 4b, and/or between the second power low pin 3b and the second power high pin 4b. Furthermore, the third protection device 1c can protect circuitry associated with the third power supply domain from ESD events received between the third signal pin 2c and the third power low pin 3c, between the third signal pin 2c and the third power high pin 4c, and/or between the third power low pin 3c and the third power high pin 4c.

In the illustrated configuration, the first signal pin 2a is electrically connected to an input of the receiver 6, and the second and third signal pins 2b, 2c are electrically connected to outputs of the first and second drivers 7a, 7b, respectively. However, other configurations are possible, including configurations using a different implementation of input and/or output circuitry. Indeed, the protection devices described herein can be used to protect input or receive pins, output or transmit pins, and/or input/output or bidirectional pins.

Each of the first to third protection circuits 1a-1c includes a first thyristor protection structure 11, a second thyristor protection structure 12, a third thyristor protection structure 13, a first diode protection structure 21, a second diode protection structure 22, a third diode protection structure 23, and a fourth diode protection structure 24.

The first diode protection structure 21 can protect against transient electrical events that cause the voltage of a signal pin to increase relative to the voltage of an associated power high supply, and the first thyristor protection structure 11 can protect against transient electrical events that cause the voltage of the signal pin to decrease relative to the voltage of the power high supply. For example, the first diode protection structure 21 and the first thyristor protection structure 11 of the first protection device 1a can be used to provide protection against ESD events received between the first signal pin 2a and the first power high pin 4a. Similarly, the first diode protection structure 21 and the first thyristor protection structure 11 of the second protection device 1b can protect against ESD events received between the second signal pin 2b and the second power high pin 4b, and the first diode protection structure 21 and the first thyristor protection structure 11 of the third protection device 1c can be used to provide protection against ESD events received between the third signal pin 2c and the third power high pin 4c.

The second diode protection structure 22 can protect against transient electrical events that cause the voltage of a signal pin to decrease relative to the voltage of an associated power low supply, and the second thyristor protection structure 12 can protect against transient electrical events that cause the voltage of the signal pin to increase relative to the voltage of the power low supply. Additionally, the third diode protection structure 23 can protect against transient electrical events that cause the voltage of a power high supply to decrease relative to the voltage of an associated power low supply, and the third thyristor protection structure 13 can protect against transient electrical events that cause the voltage of the power high supply to increase relative to the voltage of the power low supply. As will be described in detail further below, the third thyristor protection structure 13 and the third diode protection structure 23 can share at least a portion of the wells and/or diffusion regions associated with the first and second thyristor protection structures 11, 12 so as to enable multi-domain self-contained mixed-signal IO protection and/or reduce the protection circuit's area relative to a configuration using a separate supply clamp.

The first to third protection devices 1a-1c can also each include the fourth diode protection structure 24. In certain configuration, the fourth diode protection structure 24 can be electrically connected in parallel with the third diode protection structure 23, as illustrated in FIG. 1 for the second and third protection devices 1b, 1c. For example, the third and fourth diode protection structures 23, 24 of the second protection device 1b have been electrically connected in parallel between the second power high pin 4b and the second power low pin 3b. Connecting the fourth diode protection structure 24 in parallel with the third diode protection structure 23 can increase the current handling capability of the protection device against ESD events received between power high and power low supplies. However, the fourth diode protection structure 24 can be connected in other ways. For example, the fourth diode protection structure 24 of the first protection device 1a has been electrically connected between the first power high pin 4a and the substrate supply pin 5, which can function as a guard ring to reduce substrate majority carrier injection and reduce the likelihood of latch-up during normal operation or during ESD events when the integrated circuit is powered.

In certain implementations, the IC's power supply domains can be interconnected using power low decoupling circuits and/or power high decoupling circuits. For example, in the illustrated configuration, the first power low pin 3a is electrically connected to the second power low pin 3b using the first anti-parallel diode structure 10a, and the second power low pin 3b is electrically connected to the third power low pin 3c using the second anti-parallel diode structure 10b. Additionally, the first power high pin 4a is electrically connected to the second power high pin 4b using the diode 9. Interconnecting the IC's power supply domains using power low and/or power high decoupling circuits may provide multiple protection paths to an IC during a transient electrical event, since stress current can be injected from one pin to another pin in a different power supply domain through the decoupling circuits during the transient electrical event. Accordingly, in certain implementations, more than one of the protection circuits 1a-1c can activate during a transient electrical event. Although FIG. 1 illustrates a particular configuration of power high and power low decoupling circuits, other configurations are possible. Additionally, in certain implementations one or more of the power high and/or power low decoupling circuits can be omitted, added, or arranged in other ways.

Furthermore, in certain configurations, a voltage used to bias the substrate can be coupled to one or more of the power supply domains. For example, in FIG. 1 the resistor 8 has been electrically connected between the substrate supply pin 5 and the first power low pin 3a. However, other configurations are possible, such as implementations in which the substrate supply pin 5 is connected in other ways or implementations in which the substrate supply pin 5 is omitted in favor of biasing the substrate using one or more of the first to third power low pins 3a-3c.

The protection devices 1a-1c each include an integrated supply clamp for providing protection to the IC 30 against transient electrical events received between power high and power low supplies. The integrated supply clamp includes the third thyristor protection structure 13 and the third diode protection structure 23. Configuring the protection devices 1a-1c to include the integrated supply clamp can reduce the IC's overall circuit area, as well as help localize control of a clamping condition between the power rails or supplies at the signal pins, in particular for precision low voltage mixed-signal applications. Additionally, the illustrated configuration permits protection devices associated with a particular domain and/or signal pin to be configured separately from other protection devices, thereby providing a capability of independently optimizing the protection devices for high performance applications.

Various embodiments of protection devices that can be used to implement the first, second, and/or third protection circuits 1a-1c will be described below with reference to FIGS. 2A to 20. Although the protection devices have been described in the context of the integrated circuit 30 of FIG. 1, the protection devices can be used in other configurations of integrated circuits.

Figure 2A:
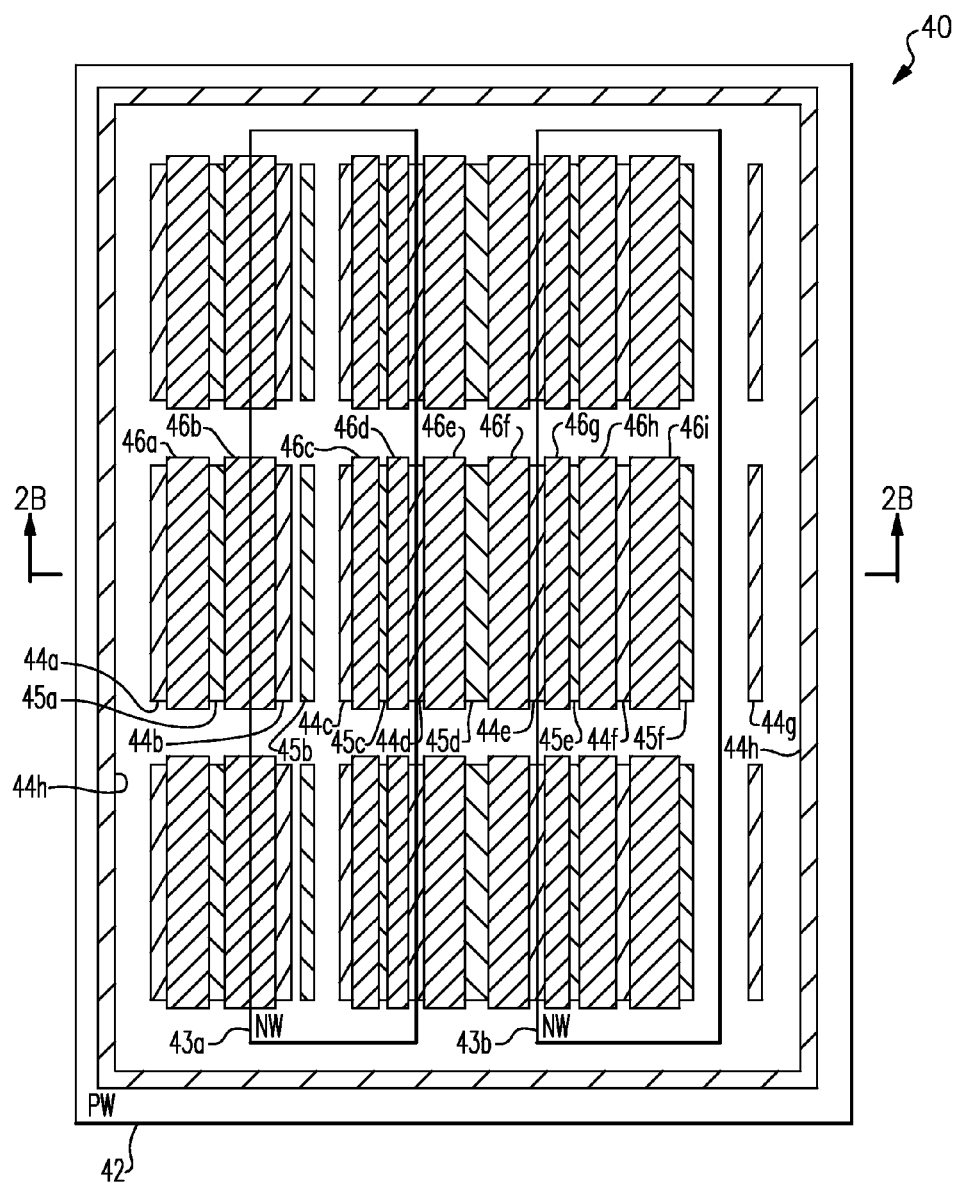
FIG. 2A is a top plan view of a protection device according to one embodiment.
Figure 2B:
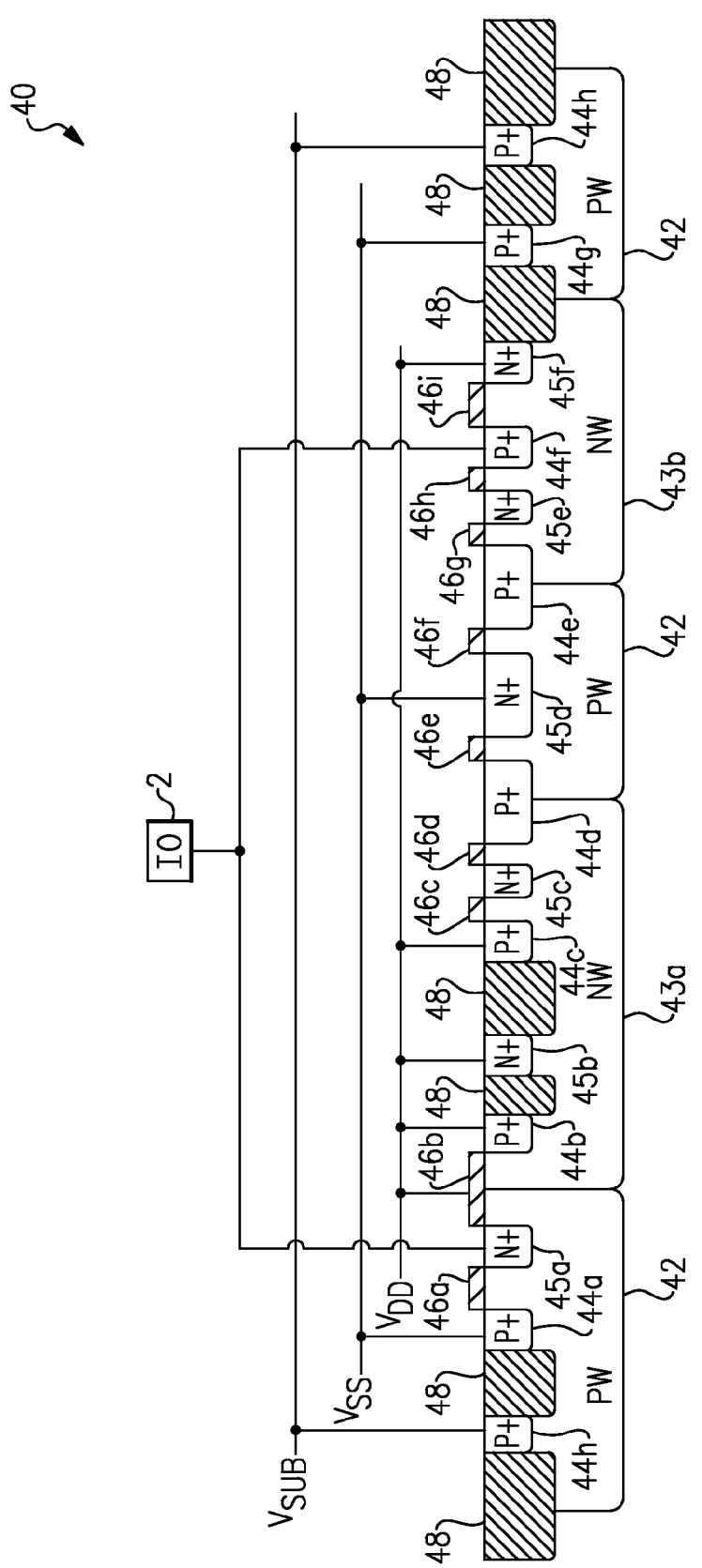
FIG. 2B is a cross section of the protection device of FIG. 2A taken along the lines 2B-2B.
Figure 2C:
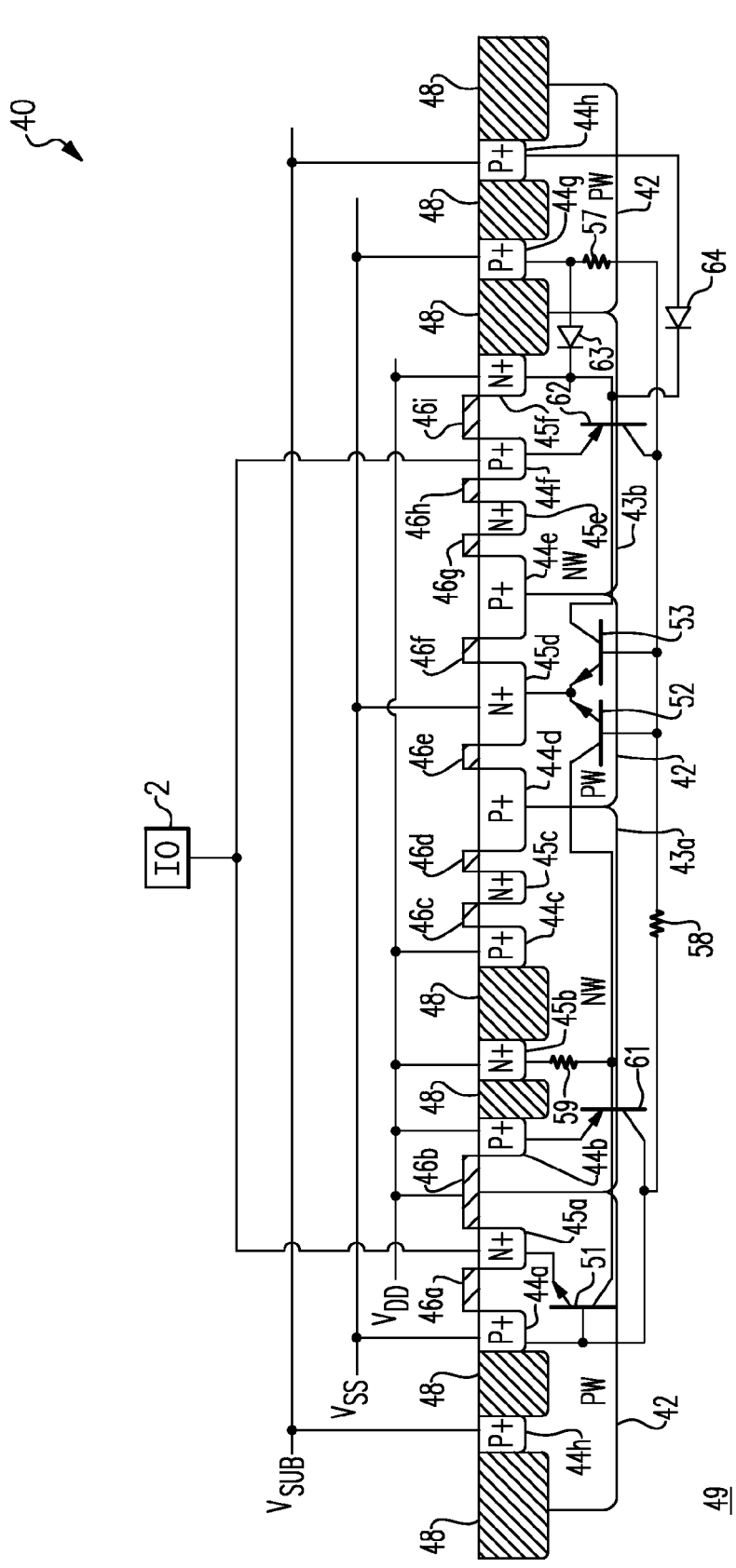
FIG. 2C is an annotated cross section of the protection device of FIG. 2A taken along the lines 2B-2B.

FIG. 2A a top plan view of a protection device 40 according to one embodiment. FIG. 2B is a cross section of the protection device 40 of FIG. 2A taken along the lines 2B-2B. FIG. 2C is an annotated cross section of the protection device 40 of FIG. 2A taken along the lines 2B-2B.

The protection device 40 includes a p-well 42, a first n-well 43a, a second n-well 43b, first to eighth p-type diffusion or P+ regions 44a-44h, first to sixth n-type diffusion or N+ regions 45a-45f, first to ninth gate regions 46a-46i, and oxide regions 48. The first to ninth gate regions 46a-46i can each include a conductive gate and a gate insulator, such as a thin oxide layer. For purposes of clarity, the oxide regions 48 have been omitted from the top plan view of FIG. 2A. The illustrated protection device 40 is fabricated in a p-type substrate 49. However, the teachings herein are applicable to other types of substrates. For example, the teachings herein are applicable to configurations using an n-type substrate in which the polarity of the illustrated active and well regions uses the opposite doping type.

As shown in FIG. 2A, the p-well 42 is disposed in the p-type substrate 49, and the first and second n-wells 43a, 43b are configured as adjacent islands in the p-well 42. Additionally, the first P+ region 44a and the first N+ region 45a are disposed in a first or left region of the p-well 42 adjacent a first side of the first n-well 43a, with the first N+ region 45a positioned between the first P+ region 44a and the first n-well 43a. Furthermore, the fourth N+ region 45d is disposed in a second or central region of the p-well 42 between a first side of the second n-well 43b and a second side of the first n-well 43a that is opposite the first side. Additionally, the seventh P+ region 44g is disposed in a third or right region of the p-well 42 adjacent a second side of the second n-well 43b that is opposite the first side. The fourth P+ region 44d extends along the second side of the first n-well 43a, and includes a first portion in the first n-well 43a and a second portion in the central region of the p-well 42. The fifth P+ region 44e extends along the first side of the second n-well 43b, and includes a first portion in the central region of the p-well 42 and a second portion in the second n-well 43b. The second P+ region 44b, the second N+ region 45b, the third P+ region 44c, and the third N+ region 45c are disposed in the first n-well 43a. The second P+ region 44b is positioned between the first and second N+ regions 45a, 45b, and the third P+ region 44c is positioned between the second and third N+ regions 45b, 45c. Additionally, the second N+ region 45b is positioned between the second and third P+ regions 44b, 44c, and the third N+ region 45c is positioned between the third and fourth P+ regions 44c, 44d. Additionally, the fifth N+ region 45e, the sixth P+ region 44f, and the sixth N+ region 45f are disposed in the second n-well 43b. The fifth N+ region 45e is positioned between the fifth and sixth P+ regions 44e, 44f, and the sixth N+ region 45f is positioned between the sixth and seventh P+ regions 44f, 44g. Additionally, the sixth P+ region 44f is positioned between the fifth and sixth N+ regions 45e, 45f. The eighth P+ region 44h has been configured as a ring that surrounds the first and second n-wells 43a, 43b, the first to sixth N+ regions 45a-45f, and the first to seventh P+ regions 44a-44g.

The protection device 40 includes the first to ninth gate regions 46a-46i, which can operate as implant blocking regions that define the position of certain diffusion regions. The first gate region 46a extends over the left region of the first p-well 42 between the first P+ region 44a and the first N+ region 45a. Additionally, the second gate region 46b extends over the left region of the p-well 42 and the first n-well 43a between the first N+ region 45a and the second P+ region 44b. Furthermore, the third gate region 46c extends over the first n-well 43a between the third P+ region 44c and the third N+ region 45c. Additionally, the fourth gate region 46d extends over the first n-well 43a between the third N+ region 45c and the fourth P+ region 44d. Furthermore, the fifth gate region 46e extends over the central region of the p-well 42 between the fourth P+ region 44d and the fourth N+ region 45d. Additionally, the sixth gate region 46f extends over the central region of the p-well 42 between the fourth N+ region 45d and the fifth P+ region 44e. Furthermore, the seventh gate region 46g extends over the second n-well 43b between the fifth P+ region 44e and the fifth N+ region 45e. Additionally, the eighth gate region 46h extends over the second n-well 43b between the fifth N+ region 45e and the sixth P+ region 44f. Furthermore, the ninth gate region 46i extends over the second n-well 43b between the sixth P+ region 44f and the sixth N+ region 45f.

In certain implementations, the first to ninth gate regions 46a-46f are implemented using metal. However, other configurations are possible, such as implementations in which the gates are made out of materials that are not metals, such as poly silicon. In certain implementations, the gate regions include a conductive structure and a dielectric structure such as silicon dioxide or a high-k dielectric.

The illustrated protection device 40 includes the oxide regions 48. Formation of the oxide or isolation regions 48 can involve etching trenches in the p-type substrate 49, filling the trenches with a dielectric, such as silicon dioxide ($SiO_2$), and removing the excess dielectric using any suitable method, such as chemical-mechanical planarization. In certain implementations, the oxide regions 48 can be shallow trench regions disposed between certain active regions.

As shown in FIG. 2A, the first to seventh P+ regions 44a-44g, the first to sixth N+ regions 45a-45f, and the first to ninth gate regions 46a-46i can be configured to extend in a first or vertical direction. Configuring the device in this manner can aid in controlling the flow of current during activation of the protection device 40 in a second or horizontal direction.

In certain configurations, the protection device 40 can be implemented using a plurality of sub-cells or building blocks that are connected to operate as the protection device. For example, in the configuration of FIGS. 2A-2C, the protection device 40 has been implemented using three sub-cells replicated in the vertical direction, which can be connected to one another using metal layers and contacts. Implementing the protection device using sub-cells can aid in providing enhanced performance by providing a structure having enhanced manufacturing process control relative to a single cell configuration. For example, using multiple sub-cells can reduce part-to-part variation in the protection device associated with fine process features or misalignment within manufacturing constraints. Such variation can affect standing leakage, current handling capability and breakdown characteristics. Using multiple sub-cells can reduce variation relative to a configuration using a single sub-cell, which can have a relatively large amount of manufacturing variation in certain processes. Although the protection device 40 has been illustrated as including three sub-cells, the protection device 40 can include more or fewer sub-cells.

As shown in FIG. 2A, the eighth P+ region 44h can be implemented as a ring that surrounds N+ regions, P+ regions, and gate regions associated with each of the sub-cells. The eighth P+ region 44h can operate as a guard ring for reducing the injection of charge from the protection device 40 into the substrate.

Although FIG. 2A illustrates one possible top or plan view of the protection device 40, other configurations are possible, such as configurations including more or fewer sub-cells and/or configurations including a different arrangements of wells, gates, and/or diffusions regions. For example, in one embodiment, the left, center, and right regions of the p-well 42 are implemented using multiple p-wells.

With reference to FIGS. 2B-2C, the cross-sections of the protection device 40 have been annotated to schematically depict various electrical connections between the protection device 40 and the signal pin 2, a power high supply $V_{DD}$, a power low supply $V_{SS}$, and a substrate supply $V_{SUB}$. In the illustrated configuration, the second gate region 46b, the second P+ region 44b, the second N+ region 45b, the third P+ region 44c, and the sixth N+ region 45f are electrically connected to the power high supply $V_{DD}$. Additionally, the first P+ region 44a, the fourth N+ region 45d, and the seventh P+ region 44g are electrically connected to the power low supply $V_{SS}$. Furthermore, the eighth P+ region 44h is electrically connected to the substrate supply $V_{SUB}$. Additionally, the first N+ region 45a and the sixth P+ region 44f are electrically connected to the signal pin 2. The illustrated electrical connections can be made, for example, using contact and metal layers, such as those associated with metallization or back-end processing.

In the illustrated configuration, the first gate region 46a and the third to ninth gate regions 46c-46i are electrically floating. The first gate region 46a and the third to ninth gate regions 46c-46i do not operate as gates of metal oxide semiconductor (MOS) transistors in this configuration, since active areas of different doping polarities have been formed on opposing sides of the gate regions. However, the first gate region 46a and the third to ninth gate regions 46c-46i have been advantageously used to operate as implant blocking regions to allow more uniform current conduction and faster response during transient stress conditions. The second gate region 46b can be associated with MOS transistors, as will be described in further detail below with reference to FIGS. 11A-11B. For example, the protection device 40 can include an NFET transistor having a gate associated with the second gate region 46b, a source associated with the first N+ region 45a, a drain associated with the first n-well 43a, and a body associated with the left region of the p-well 42. Additionally, the protection device 40 can include a PFET transistor having a gate associated with the second gate region 46b, a source associated with the second P+ region 44b, a drain associated with the left region of the p-well 42, and a body associated with the first n-well 43a. Additional details of the FET structures will be described in detail further below with reference to FIGS. 11A-11B.

The substrate supply $V_{SUB}$ has been electrically connected to the eighth P+ region 44h, which in certain implementations can be positioned along an outer perimeter of the protection device 40 to operate as a guard ring. Connecting the substrate supply $V_{SUB}$ to the eighth P+ region 44h can reduce carrier injection and/or the risk of latch-up when the protection device is integrated on-chip. In one embodiment, the eighth P+ region 44h is Kelvin-connected to a pin that supplies the substrate supply $V_{SUB}$. For example, the eighth P+ region 44h can be connected such that a resistance between the eighth P+ region 44h and the substrate pin is greater than a resistance between the p-type substrate 49 and the substrate pin. Although the protection device 40 is illustrated as including both the substrate supply $V_{SUB}$ and the power low supply $V_{SS}$, other configurations are possible, including, for example, implementations in which the substrate supply $V_{SUB}$ is omitted in favor of electrically connecting the eighth P+ region 44h to the power low supply $V_{SS}$.

In certain implementations, a common $V_{SS}$ pin is used to supply both the power low supply $V_{SS}$ and the substrate supply $V_{SUB}$, but the substrate supply $V_{SUB}$ is Kelvin-connected to the $V_{SS}$ pin. By using an independent or separate Kelvin connection in metal from the eighth P+ region 44h to the $V_{SS}$ pin, a power low supply connection to the protection device 40 can be optimized to handle high current during an ESD event. For example, the protection device's power low supply connection can be independently connected in wide metal from the $V_{SS}$ pin to the terminals of the device, for instance to the first and seventh P+ regions 44a, 44g and to the fourth N+ region 45d. By configuring the protection device in this manner, the substrate supply $V_{SUB}$ can be independently provided via Kelvin-connection to the eighth P+ region 44h, thereby minimizing the voltage potential difference that can be generated during a high current discharge between the location of the protection device 40 on chip and the $V_{SS}$ pin. Additionally, configuring the device in this manner can help prevent latchup-induced damage into a powered integrated circuit formed in the common substrate, as latchup can be associated with large substrate voltage differences and large charge injection into the substrate 49 via the p-well 42 during an ESD event or during IO current injection latchup testing.

The protection device 40 of FIG. 2C has been annotated to show certain equivalent circuit devices formed from the illustrated structure, such as a first NPN bipolar transistor 51, a second NPN bipolar transistor 52, a third NPN bipolar transistor 53, a first resistor 57, a second resistor 58, a third resistor 59, a first PNP bipolar transistor 61, a second PNP bipolar transistor 62, a first diode 63, and a second diode 64.

The first NPN bipolar transistor 51 includes an emitter associated with the first N+ region 45a, a base associated with the left region of the p-well 42, and a collector associated with the first n-well 43a. The second NPN bipolar transistor 52 includes an emitter associated with the fourth N+ region 45d, a base associated with the central region of the p-well 42, and a collector associated with the first n-well 43a. The third NPN bipolar transistor 53 includes an emitter associated with the fourth N+ region 45d, a base associated with the central region of the p-well 42, and a collector associated with the second n-well 43b. The first PNP bipolar transistor 61 includes an emitter associated with the second P+ region 44b, a base associated with the first n-well 43a, and a collector associated with the p-type substrate 49. The second PNP bipolar transistor 62 includes an emitter associated with the sixth P+ region 44f, a base associated with the second n-well 43b, and a collector associated with the p-type substrate 49. The first diode 63 includes a cathode associated with the first and second n-wells 43a, 43b and an anode associated with the p-well 42 and the first and seventh P+ regions 44a, 44g. The second diode 64 includes a cathode associated with the first and second n-wells 43a, 43b and an anode associated with the p-well 42 and the eighth P+ region 44h.

The first resistor 57 is associated with a resistance of the p-well 42 between the power low supply $V_{SS}$ and the collector of the second PNP bipolar transistor 62. The second resistor 58 is associated with a resistance of the p-type substrate 49 between the collector of the first PNP bipolar transistor 61 and the bases of the second and third NPN bipolar transistors 52, 53. The third resistor 59 is associated with a resistance of the first n-well 43a between the power high supply $V_{DD}$ and the base of the first PNP bipolar transistor 61.

Figure 3:
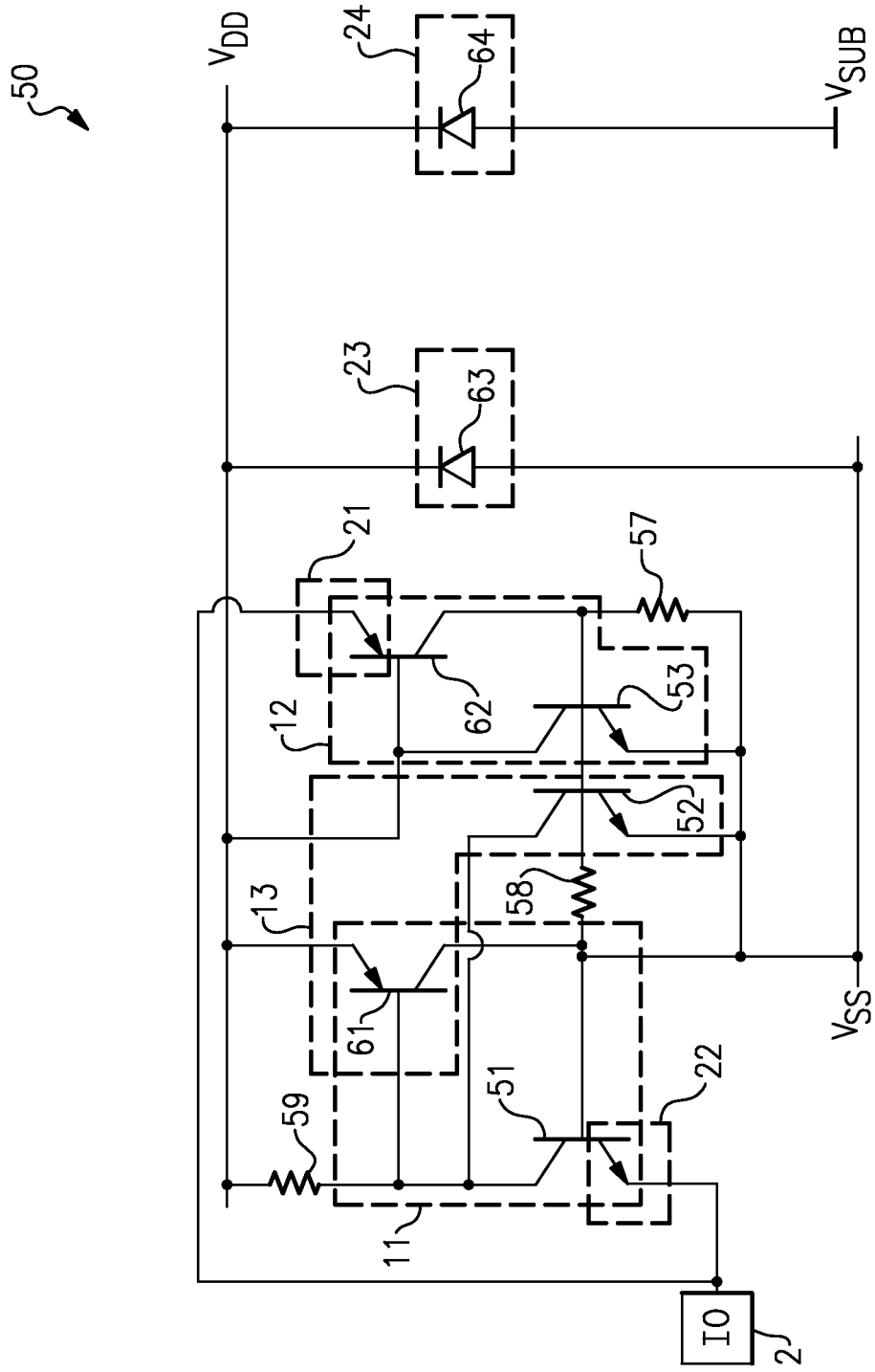
FIG. 3 is a circuit diagram of the protection device of FIGS. 2A-2C.

FIG. 3 is a circuit diagram 50 of the protection device 40 of FIGS. 2A-2C. The circuit diagram 50 includes the first NPN bipolar transistor 51, the second NPN bipolar transistor 52, the third NPN bipolar transistor 53, the first resistor 57, the second resistor 58, the third resistor 59, the first PNP bipolar transistor 61, the second PNP bipolar transistor 62, the first diode 63, and the second diode 64, which can be as described earlier with reference to FIG. 2C. The circuit diagram 50 illustrates various connections between the components and the signal pin 2, the power high supply $V_{DD}$, the power low supply $V_{SS}$, and the substrate supply $V_{SUB}$.

The first resistor 57 includes a first end electrically connected to the power low supply $V_{SS}$ and a second end electrically connected to a first end of the second resistor 58, to a base of the second NPN bipolar transistor 52, to a base of the third NPN bipolar transistor 53, to a collector of the second PNP bipolar transistor 62. The second resistor 58 further includes a second end electrically connected to the power low supply $V_{SS}$. The third resistor 59 includes a first end electrically connected to the power high supply $V_{DD}$ and a second end electrically connected to a collector of the first NPN bipolar transistor 51, to a collector of the second NPN bipolar transistor 52, and to a base of the first PNP bipolar transistor 61. The first NPN bipolar transistor 51 further includes an emitter electrically connected to the signal pin 2 and a base electrically connected to the power low supply $V_{SS}$. The second NPN bipolar transistor 52 further includes an emitter electrically connected to the power low supply $V_{SS}$. The third NPN bipolar transistor 53 further includes an emitter electrically connected to the power low supply $V_{SS}$ and a collector electrically connected to power high supply $V_{DD}$. The first PNP bipolar transistor 61 further includes an emitter electrically connected to the power high supply $V_{DD}$ and a collector electrically connected to the power low supply $V_{SS}$. The second PNP bipolar transistor 62 further includes a base electrically connected to the power high supply $V_{DD}$ and an emitter electrically connected to the signal pin 2. The first diode 63 includes a cathode electrically connected to the power high supply $V_{DD}$ and an anode electrically connected to the power low supply $V_{SS}$. The second diode 64 includes a cathode electrically connected to the power high supply $V_{DD}$ and an anode electrically connected to the substrate supply $V_{SUB}$.

With reference to FIGS. 2A-3, the protection device 40 can be used to protect against various transient electrical events. For example, the protection device 40 includes a first diode protection structure 21 associated with an emitter-base junction of the second PNP bipolar transistor 62, which can correspond to a junction between the sixth P+ region 44f and the second n-well 43b of FIG. 2A-2C. The first diode protection structure 21 can be used to protect an IC against transient electrical events that cause the voltage of the signal pin 2 to increase relative to the voltage of the power high supply $V_{DD}$. Additionally, the protection device 40 further includes a first thyristor protection structure or PNPN silicon controlled rectifier (SCR) structure 11 associated with the first NPN bipolar transistor 51 and the first PNP bipolar transistor 61, which are cross-coupled. The first thyristor protection structure 11 can correspond to the PNPN structure of the second P+ region 44b, the first n-well 43a, the left region of the p-well 42, and the first N+ region 45a of FIG. 2A-2C. The first thyristor protection structure 11 can be used to protect the IC against transient electrical events that cause the voltage of the signal pin 2 to decrease relative to the voltage of the power high supply $V_{DD}$.

Additionally, the protection device 40 further includes a second diode protection structure 22 associated with a base-emitter junction of the first NPN bipolar transistor 51, which can correspond to a junction between the left region of the p-well 42 and the first N+ region 45a of FIGS. 2A-2C. The second diode protection structure 22 can be used to protect the IC against transient electrical events that cause the voltage of the signal pin 2 to decrease relative to the voltage of the power low supply $V_{SS}$. Furthermore, the protection device 40 further includes a second thyristor protection structure 12 associated with the third NPN bipolar transistor 53 and the second PNP bipolar transistor 62, which are cross-coupled. The second thyristor protection structure 12 can correspond to the PNPN structure of the sixth P+ region 44f, the second n-well 43b, the central region of the p-well 42, and the fourth N+ region 45d. The second thyristor protection structure 12 can be used to protect the IC against transient electrical events that cause the voltage of the signal pin 2 to increase relative to the voltage of the power low supply $V_{SS}$.

With continuing reference to FIGS. 2A-3, the protection device 40 further includes an integrated supply clamp that includes a third thyristor protection structure 13 and a third diode protection structure 23. The third thyristor protection structure 13 is associated with the second NPN bipolar transistor 52 and the first PNP bipolar transistor 61, which are cross-coupled. The third thyristor protection structure 13 can correspond to the PNPN structure of the second P+ region 44b, the first n-well 43a, the central region of the p-well 42, and the fourth N+ region 45d. The third thyristor protection structure 13 can be used to protect the IC from transient electrical events that increase the voltage of the power high supply $V_{DD}$ relative to the voltage of the power low supply $V_{SS}$. The third diode protection structure 23 can be associated with the first diode 63, which can correspond to a junction between the left region of the p-well 42 and the first n-well 43a and with a junction between the right region of the p-well 42 and the second n-well 43b. The third diode protection structure 23 can be used to protect the IC from transient electrical events that decrease the voltage of the power high supply $V_{DD}$ relative to the voltage of the power low supply $V_{SS}$.

As shown in FIGS. 2A-2C, the third thyristor protection structure 13 and the third diode protection structure 23 share a portion of the wells and diffusion regions associated with the first and second thyristor protection structures 11, 12. Accordingly, the protection device can be implemented in a fraction of the footprint or area relative to a protection scheme using a supply clamp implemented using a separate layout.

As described above, the first and second diode protection structures 21, 22 are formed from the base-emitter junctions of the second PNP bipolar transistor 62 and the first NPN bipolar transistor 51, respectively. The base-emitter junctions can have a relatively low capacitance relative to certain other diode structures, and thus can have a relatively small impact on the speed and/or signal integrity of signals transmitted or received on the signal pin 2.

With continued reference to FIGS. 2A-3, the protection device 40 further includes a fourth diode protection structure 24 associated with the second diode 64, which can correspond to a junction between the left region of the p-well 42 and the first n-well 43a and with a junction between the right region of the p-well 42 and the second n-well 43b. The fourth diode protection structure 24 can help protect the p-well 42 from damage during a transient electrical event. In the illustrated configuration, the anode of the second diode 64 is electrically connected to the substrate voltage $V_{SUB}$. However, other configurations are possible. For example, in one embodiment the substrate voltage $V_{SUB}$ is omitted in favor of connecting the anode of the second diode 64 to the power low supply $V_{SS}$. In such a configuration, the fourth diode protection structure 24 can operate in parallel with the third diode protection structure 23, thereby increasing the protection device's current handling capability for ESD events that increase the voltage of the power low supply $V_{SS}$ relative to the voltage of the power high supply $V_{DD}$.

Figure 4A:
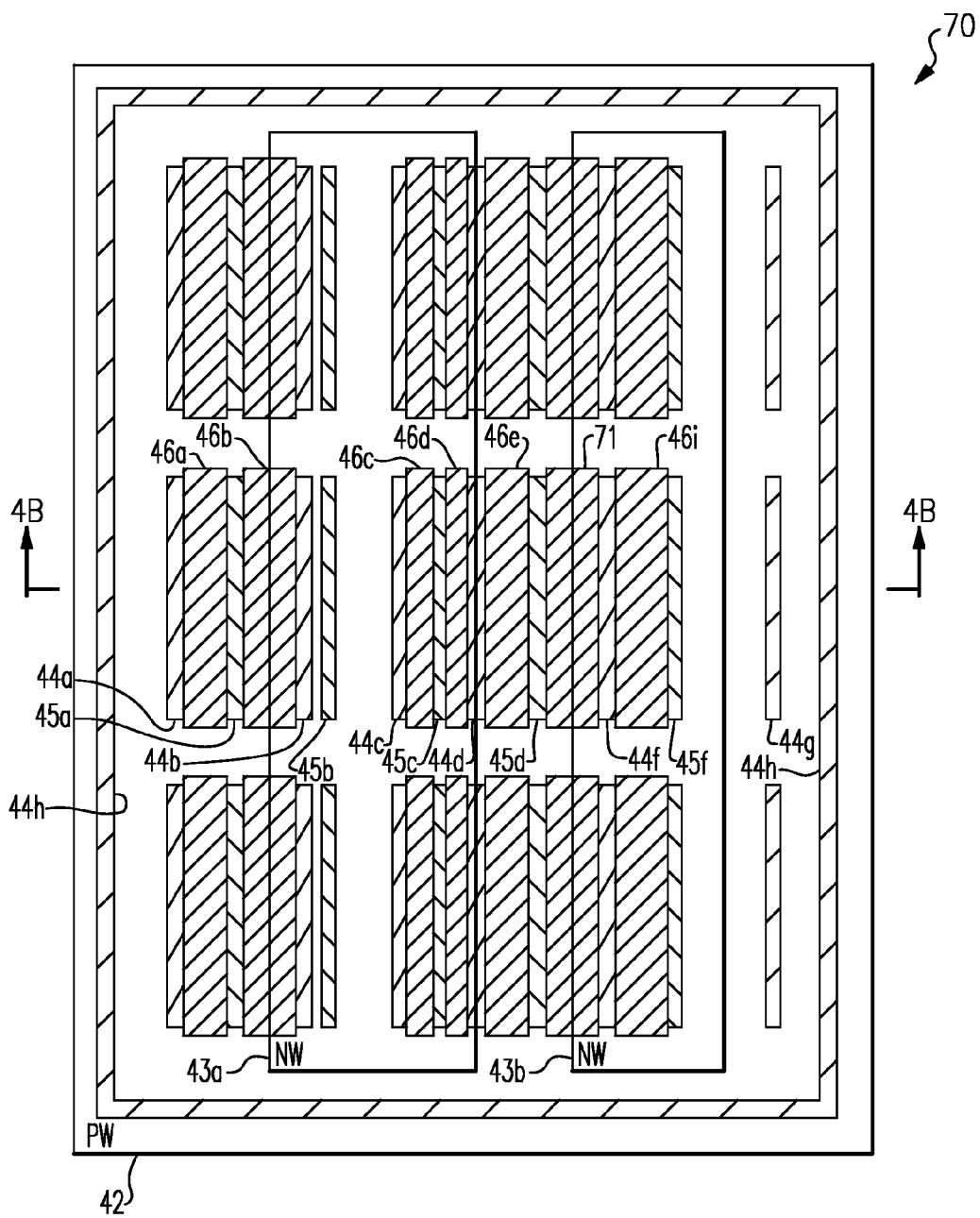
FIG. 4A is a top plan view of a protection device according to another embodiment.
Figure 4B:
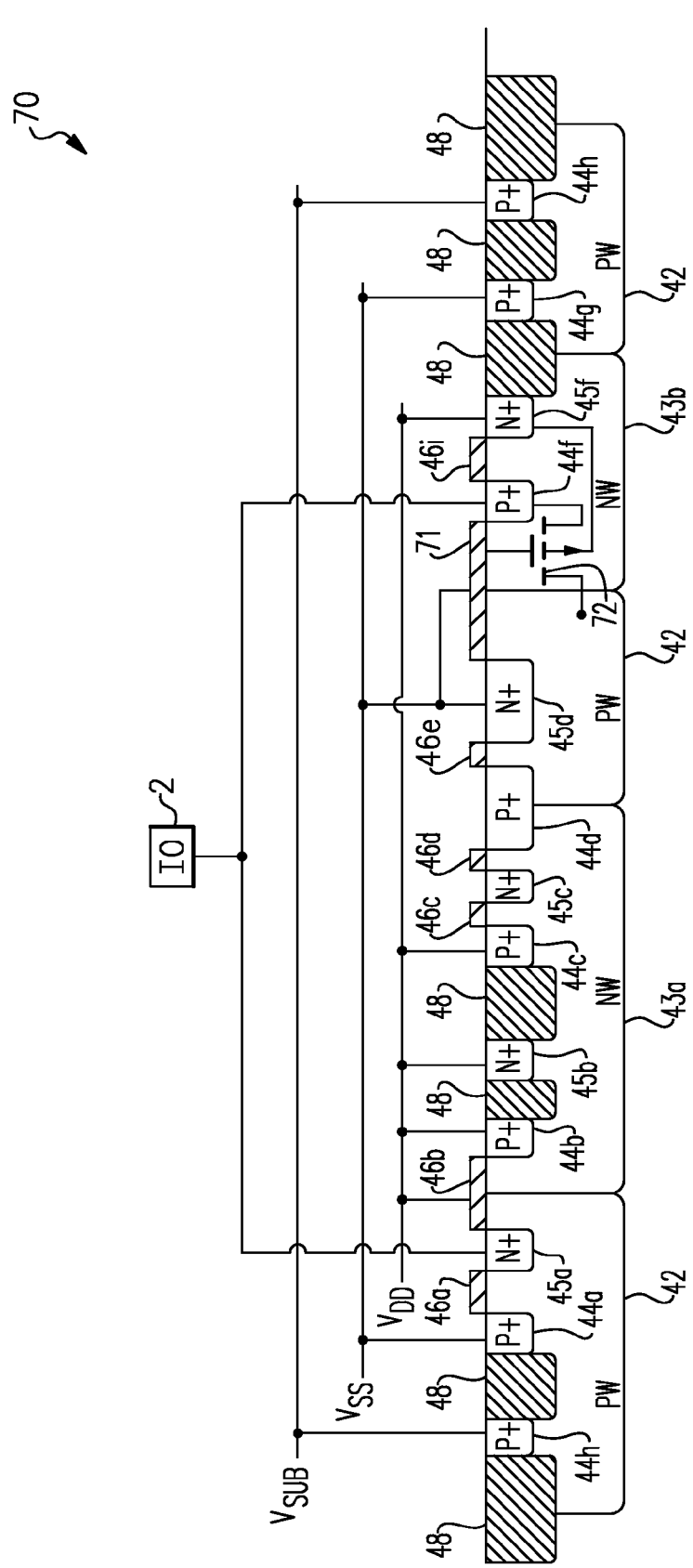
FIG. 4B is a cross section of the protection device of FIG. 4A taken along the lines 4B-4B.

FIG. 4A is a top plan view of a protection device 70 according to another embodiment. FIG. 4B is a cross section of the protection device 70 of FIG. 4A taken along the lines 4B-4B.

The protection device 70 of FIGS. 4A-4B is similar to the protection device 40 of FIGS. 2A-2C, except that the protection device 70 of FIGS. 4A-4B illustrates a configuration in which the fifth P+ region 44e and fifth N+ region 45e have been omitted. Additionally, the sixth to eighth gate regions 46f-46h have been omitted in favor of using a gate region 71, which extends over the p-well 42 and the second n-well 43b between the fourth N+ region 45d and the sixth P+ region 44f. As shown in FIG. 4B, the gate region 71 is electrically connected to the power low supply $V_{SS}$.

FIG. 4B has been annotated to include the p-type field-effect transistor (PFET) 72. The PFET 72 includes a gate associated with the gate region 71, a source associated with the sixth P+ region 44f, a drain associated with the central region of the p-well 42, and a body associated with the second n-well 43b.

The PFET 72 can enhance the protection against stress conditions between the signal pin 2 and the power low supply $V_{SS}$. For example, when an ESD event causes the voltage of the signal pin 2 to increase relative to the voltage of the power low supply $V_{SS}$, the PFET 72 can activate and provide current into the base of a corresponding bipolar transistor, thereby improving ESD performance. Additionally, the parasitic gate-to-source capacitance of the PFET 72 can aid in providing a displacement current or C*dV/dt current that can expedite or speed-up the activation of the protection device 70 when an ESD event causes the voltage of the power low supply $V_{SS}$ to change with time. Thus, including the gate region 71 can substantially expedite the protection device's response during a stress condition. Although including the gate region 71 can enhance the protection device's on-state performance, including the gate region 71 can also increase the protection device's off-state power consumption, since the PFET 72 can have an associated leakage current. In certain implementations, the PFET 72 is configured as a high threshold voltage device so as to reduce off-state conduction between the signal pin 2 and the power high supply $V_{DD}$ and to prevent the PFET 72 from interfering from signals received or transmitted on the signal pin 2. Additional details of the protection device 70 can be similar to those described earlier with respect to FIGS. 2A-3.

Persons having ordinary skill in the art will appreciate that one or more of the protection devices 40 of FIGS. 2A-2C and/or one or more of the protection devices 70 of FIGS. 4A-4B can be used to provide protection to the pins of an integrated circuit. For example, in certain implementations, the protection device 70 of FIGS. 3A-3B is used to protect a first signal pin associated with a first power supply domain, and the protection device 40 of FIGS. 2A-2C is used to protect a second signal pin associated with a second power supply domain that has a higher voltage than the first power supply domain. For example, in one embodiment, the protection device 70 of FIGS. 3A-3B is used to protect a 0.9 V signal pin and the protection device 40 of FIGS. 2A-2C is used to protect a 1.8 V signal pin. However, other configurations are possible.

Figure 4C:
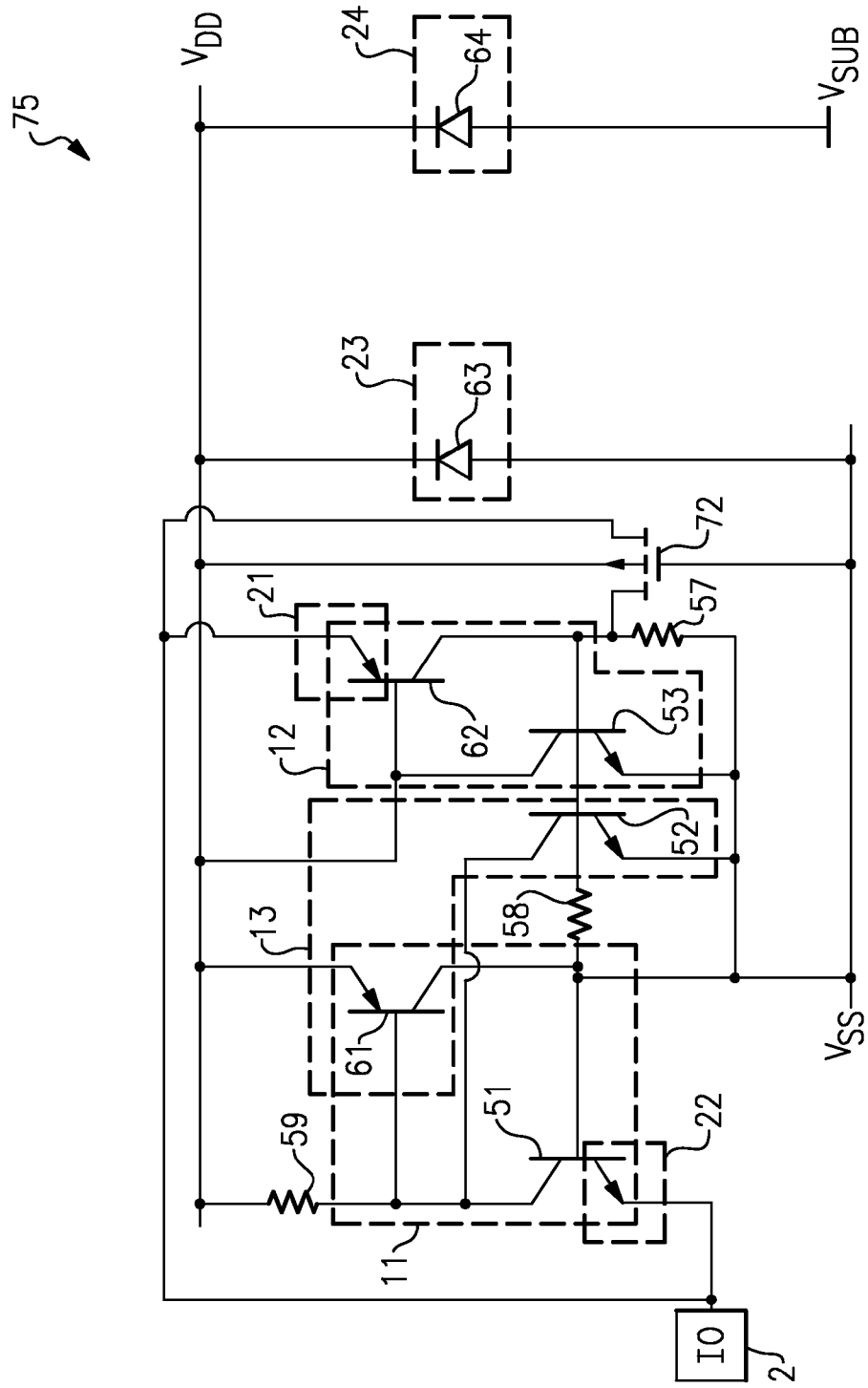
FIG. 4C is a circuit diagram of the protection device of FIGS. 4A-4B.

FIG. 4C is a circuit diagram 75 of the protection device 70 of FIGS. 4A-4B. The circuit diagram 75 of FIG. 4C is similar to the circuit diagram 50 of FIG. 3, except that the circuit diagram 75 of FIG. 4C further includes the PFET transistor 72. As shown in FIG. 4C, the PFET transistor 72 includes a gate electrically connected to the power low supply $V_{SS}$, a drain electrically connected to the base of the third NPN bipolar transistor 53, a source electrically connected to the signal pin 2, and a body electrically connected to the power high supply $V_{DD}$. During a transient electrical event between the signal pin 2 and power low supply $V_{SS}$, the PFET transistor 72 can turn-on and provide a current into the base of the third NPN bipolar transistor 53, thereby expediting activation of the second thyristor protection structure 12. In certain implementations, the PFET 72 is configured as a high threshold voltage device so as to reduce off-state conduction between the signal pin 2 and the power high supply $V_{DD}$ and to prevent the PFET 72 from interfering from signals received or transmitted on the signal pin 2. For example, as will be described below with reference to FIG. 12, the PFET 72 can be configured to have a high threshold voltage by implementing the gate of the PFET 72 using n-metal. However, other configurations for achieving high threshold voltage are possible, such as use of selective high k dielectric, thicker oxide formation, and/or selective channel doping. Additional details of the circuit diagram 75 can be as described earlier.

Figure 5:
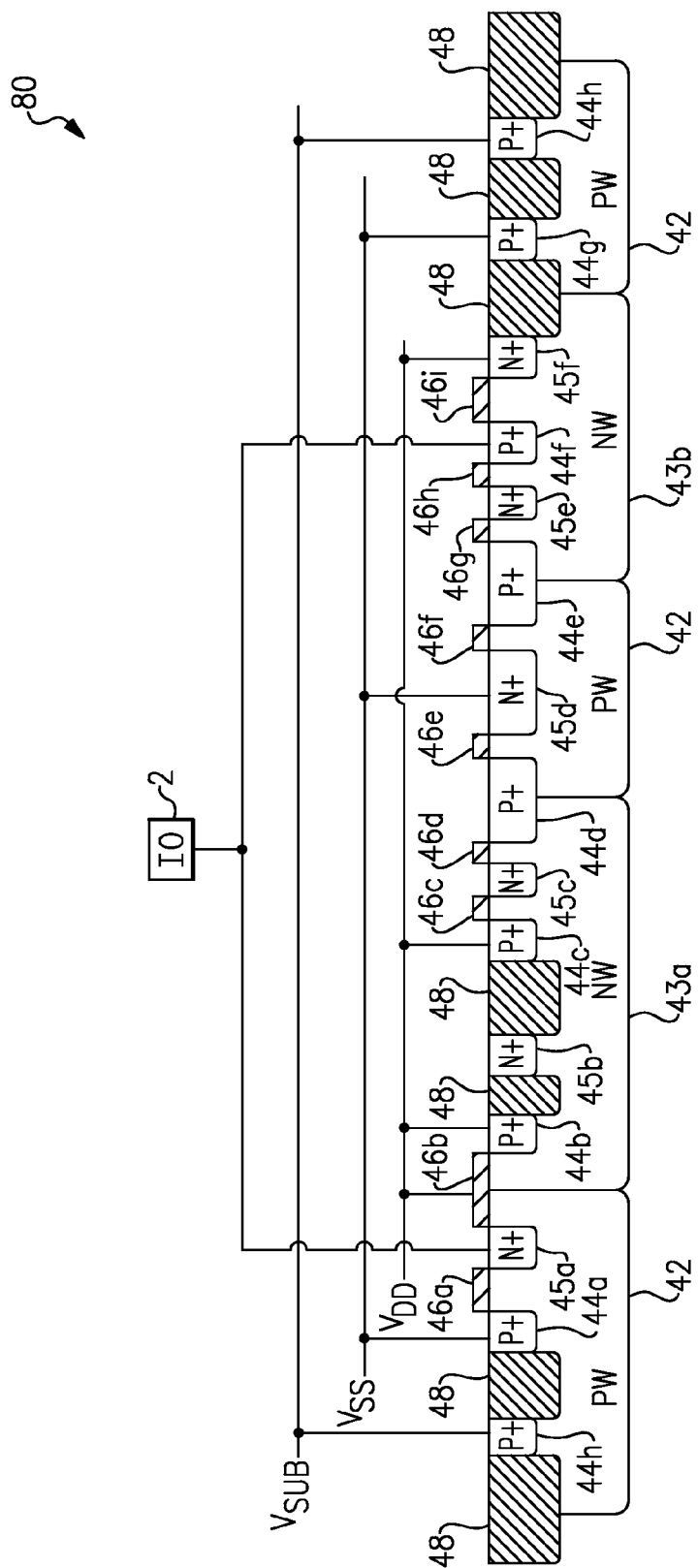
FIGS. 5-10 are cross sections of various embodiments of protection devices.

FIG. 5 is a cross section of a protection device 80 according to another embodiment. The protection device 80 of FIG. 5 is similar to the protection device 40 of FIGS. 2A-2C, except that the protection device 80 illustrates a configuration in which the second N+ region 45b is electrically floating, rather than electrically connected to the power high supply $V_{DD}$. Configuring the protection device 80 in this manner provides a breakdown voltage collector-emitter open (BVCEO) characteristic between the power high supply $V_{DD}$ and the signal pin 2, which can lower the protection device's trigger voltage for an ESD event received between the power high supply $V_{DD}$ and the signal pin 2 relative to the configuration shown in FIGS. 2A-2C.

Additionally, the protection device 80 of FIG. 5 can have reduced MOS-induced leakage relative to the protection device 40 of FIGS. 2A-2C. For example, the protection device 80 can include an NFET transistor having a gate associated with the second gate region 46b, a source associated with the first N+ region 45a, a drain associated with the first n-well 43a, and a body associated with the left region of the p-well 42. Configuring the second N+ region 45b to be electrically floating can reduce leakage between the power high supply $V_{DD}$ and the signal pin 2 through the NFET transistor, since the connection between the NFET's drain and the power high supply $V_{DD}$ can be disconnected.

Persons having ordinary skill in the art will appreciate that any of the protection devices described herein can be configured with the second N+ region 45b electrically floating so as to reduce the protection device's trigger voltage. Indeed, implementing the protection devices described herein with a BVCEO characteristic is one of many possible device variations suitable for providing fine-tune adjustment of the protection device's characteristics so as to provide protection suitable for a particular application and/or fabrication process.

Figure 6:
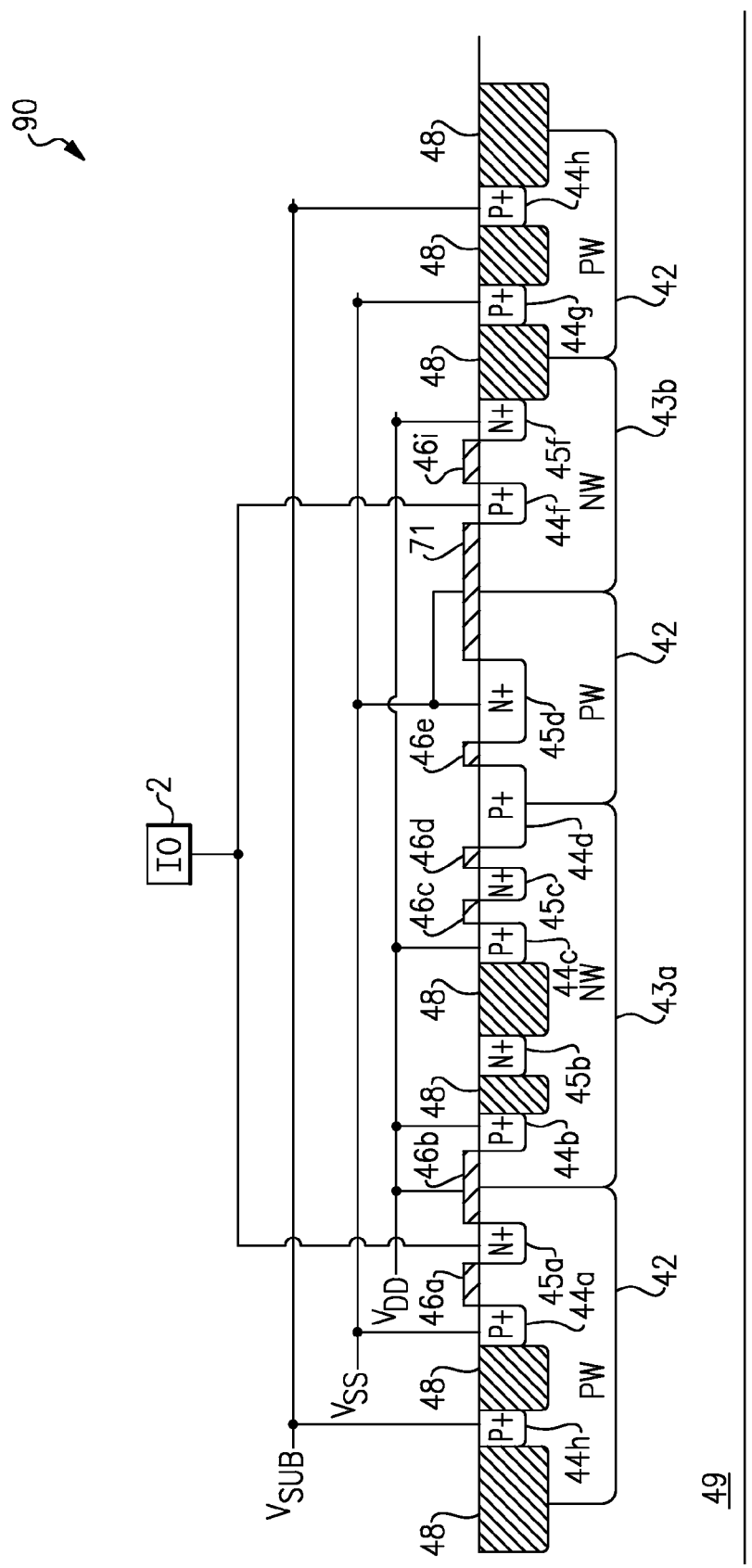

FIG. 6 is a cross section of a protection device 90 according to another embodiment. The protection device 90 of FIG. 6 is similar to the protection device 70 of FIGS. 4A-4B, except that the protection device 90 illustrates a configuration in which the second N+ region 45b is electrically floating, rather than electrically connected to the power high supply $V_{DD}$. Configuring the protection device 90 in this manner provides a BVCEO characteristic between the power high supply $V_{DD}$ and the signal pin 2. Additionally, the protection device 90 of FIG. 6 can have reduced MOS-induced leakage relative to the protection device 70 of FIGS. 4A-4B. For example, the protection device 90 can have reduced leakage between the power high supply $V_{DD}$ and the signal pin 2, since an NFET transistor associated with the second gate region 46b can have a drain that is disconnected from the power high supply $V_{DD}$. Additional details of the protection device 90 can be similar to those described earlier.

Figure 7:
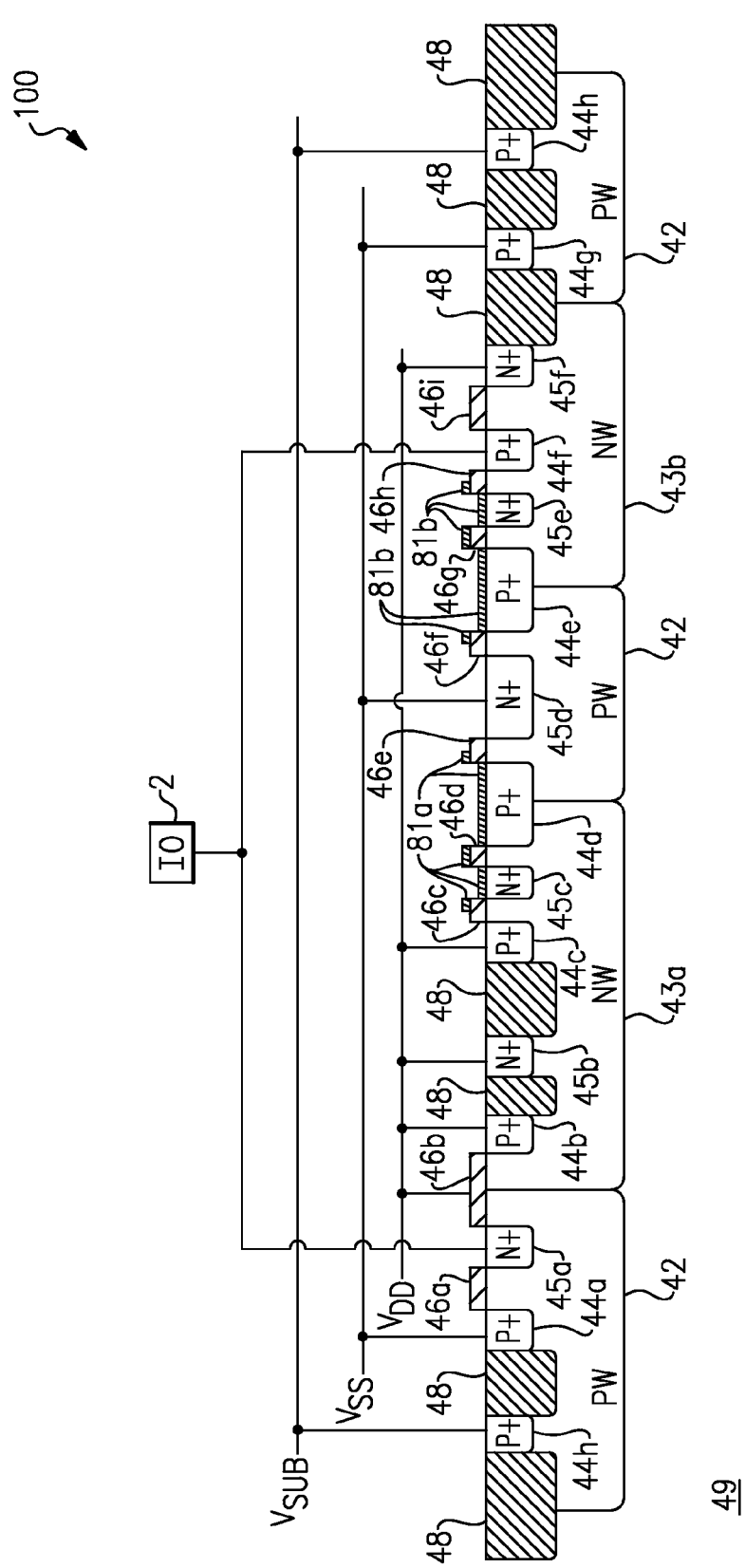

FIG. 7 is a cross section of a protection device 100 according to another embodiment. The protection device 100 of FIG. 7 is similar to the protection device 40 of FIGS. 2A-2C, except that the protection device 100 further includes a first resist protective oxide (RPO) region 81a and a second RPO region 81b. In the illustrated configuration, the first RPO region 81a is disposed over the third N+ region 45c, over the fourth gate region 46d, over the fourth P+ region 44d, and over a portion of the third and fifth gate regions 46c, 46e. Additionally, the second RPO region 81b is disposed over the fifth P+ region 44e, over the seventh gate region 46g, over the fifth N+ region 45e, and over a portion of the sixth and eighth gate regions 46f, 46h. However, other configurations of the first and second RPO regions 81a, 81b are possible and/or implementations in which the first or second RPO regions 81a, 81b are omitted.

The first and second RPO regions 81a, 81b can be used to prevent local formation of a silicide layer on a surface of the protection device 100 during processing. A silicide layer can have a relatively low resistance, and thus can have a high current density during an ESD event. In certain instances, blocking the silicide formation can further enhance high stress current handling capability, as high currents through the silicide layer and/or close to the semiconductor surface can lead to device damage, such as silicide melting associated with Joule heating and lower melting point of the silicide formation. Accordingly, using the first and second RPO regions 81a, 81b to prevent formation of a silicide layer (while silicide is formed on other contact regions) can increase the protection device's robustness during overstress by relatively increasing an amount of current that flows through the protection device's deeper semiconductor regions, such as the protection device's wells and diffusion regions, compared to the absence of the RPO regions.

Figure 8:
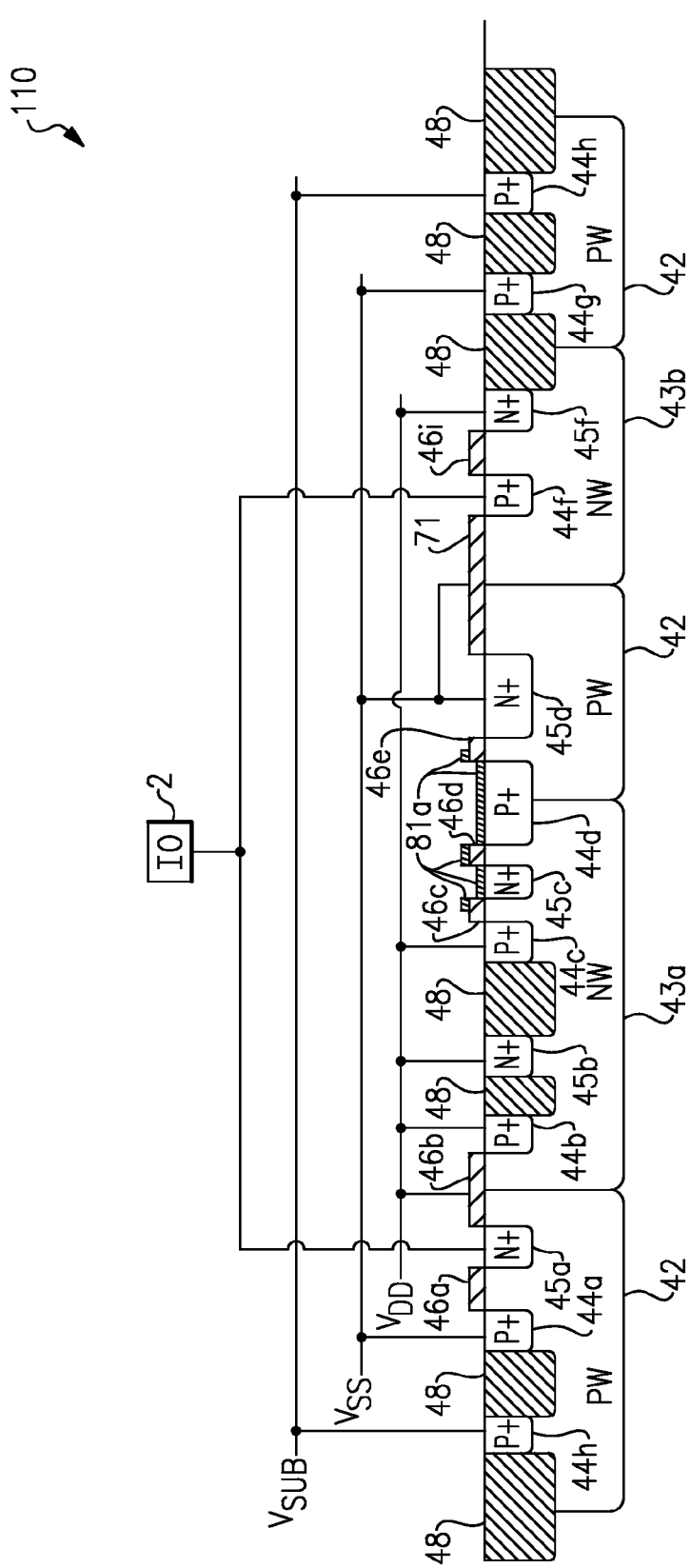

FIG. 8 is a cross section of a protection device 110 according to another embodiment. The protection device 110 of FIG. 8 is similar to the protection device 70 of FIGS. 4A-4B, except that the protection device 110 further includes the first RPO region 81a. Additional details of the protection device 110 can be similar to those described earlier.

Figure 9:
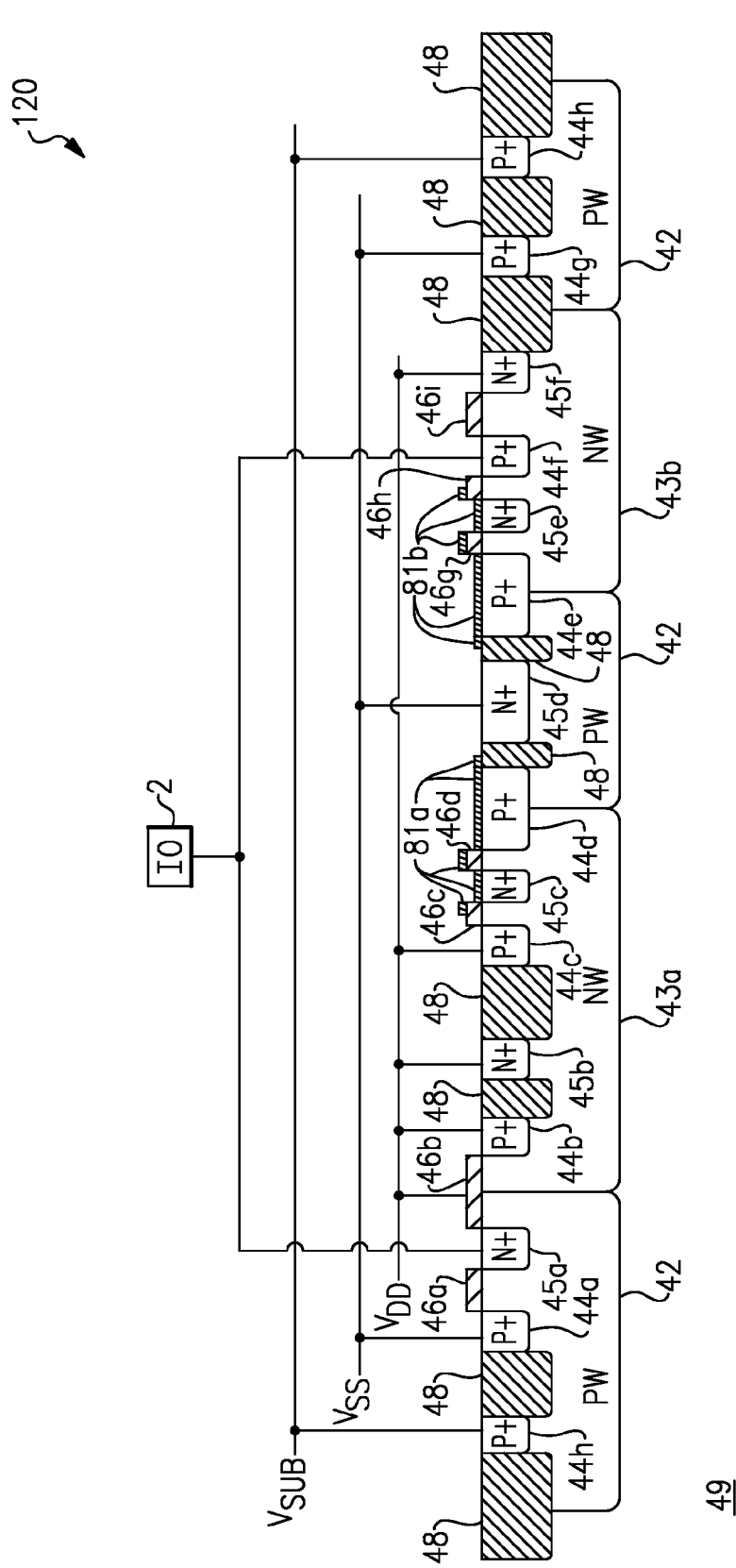

FIG. 9 is a cross section of a protection device 120 according to another embodiment. The protection device 120 of FIG. 9 is similar to the protection device 100 of FIG. 7, except that the protection device 120 illustrates a configuration in which the fifth and sixth gate regions 46e, 46f are omitted in favor of including oxide regions 48 both between the fourth N+ region 45d and the fourth P+ region 44d and between the fourth N+ region 45d and the fifth P+ region 44e. Inclusion of the oxide regions 48 in this configuration can reduce the protection device's leakage current between the power high supply $V_{DD}$ and the power low supply $V_{SS}$ and increase overvoltage trigger. For example, the oxide regions 48 can decrease the leakage current between the fourth N+ region 45d and the fourth and fifth P+ regions 44d, 44e. Additionally, including the oxide regions 48 in this configuration can increase field constraints for breakdown between the fourth N+ region 45d and the power high supply $V_{DD}$ (via the third P+ region 44c or the second N+ region 45b) and/or between the fourth N+ region 45d and the signal pin 2 (via the sixth P+ region 44f). Additional details of the protection device 120 can be similar to those described earlier.

Although the configuration of oxide regions 48 shown in FIG. 9 is illustrated in combination with the first and second RPO regions 81a, 81b, the oxide regions 48 can be implemented in this manner in implementations in which the first and/or second RPO regions 81a, 81b are omitted or arranged in other ways. Indeed, the variations of protection devices described herein can be selectively combined to provide further protection device configurations suitable for a particular application or fabrication process. Thus, certain features shown in the context of one protection device can be incorporated into other protection devices as well.

Figure 10:
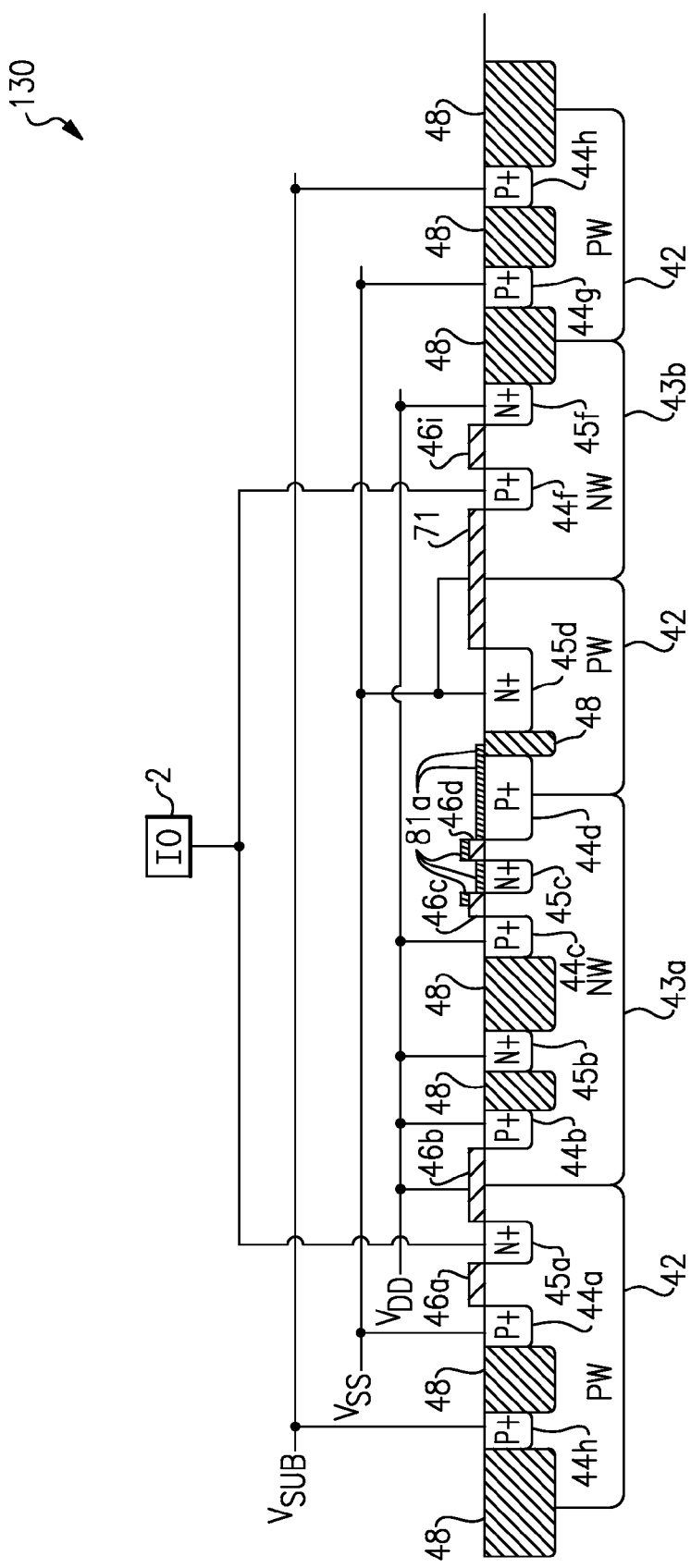

FIG. 10 is a cross section of a protection device 130 according to another embodiment. The protection device 130 of FIG. 10 is similar to the protection device 110 of FIG. 8, except that the protection device 130 illustrates a configuration in which the fifth gate region 46e is omitted in favor of including the oxide region 48 between the fourth N+ region 45d and the fourth P+ region 44d. Configuring the protection device 130 in this manner can reduce the protection device's leakage current between the power high supply $V_{DD}$ and the power low supply $V_{SS}$ and increase overvoltage trigger. Additionally, the oxide region 48 can increase field constraints for breakdown between the fourth N+ region 45d and the power high supply $V_{DD}$ via the third P+ region 44c or the second N+ region 45b. Additional details of the protection device 130 can be similar to those described earlier.

Figure 11A:
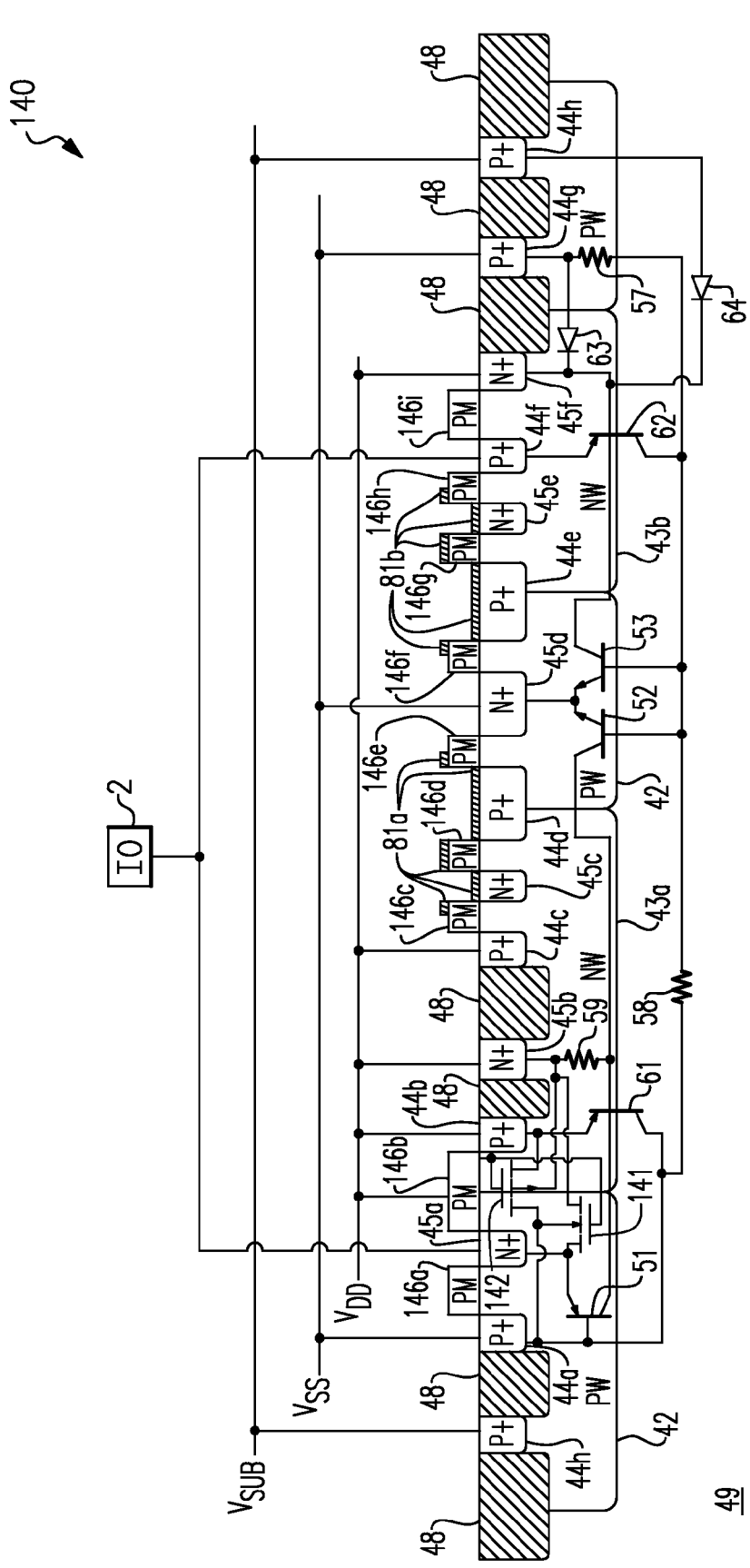
FIG. 11A is an annotated cross section of a protection device according to another embodiment.

FIG. 11A is an annotated cross section of a protection device 140 according to another embodiment. The protection device 140 of FIG. 11A is similar to the protection device 100 of FIG. 7, except that FIG. 11A illustrates an implementation in which the first to ninth gate regions 46a-46i of FIG. 7 have been implemented using the first to ninth p-metal gates 146a-146i, respectively.

In certain processes, such as high-k metal gate CMOS processes, metals can be used to implement the gates of NFET and PFET transistors. Additionally, the composition and/or processing of the gate metal of PFET transistors and the gate metal of NFET transistors can be separately configured to achieve work functions corresponding to suitable threshold voltages for NFET and PFET transistors. As used herein, p-metal (PM) can correspond to a gate metal structure associated with the process's PFET transistors and n-metal (NM) can correspond to a gate metal structure associated with the process's NFET transistors.

The protection device 140 has been annotated to include various devices described earlier with reference to FIG. 2A, such as the first to third NPN bipolar transistors 51-53, the first to third resistors 57-59, the first and second PNP bipolar transistors 61, 62, and the first and second diodes 63, 64. Additionally, the protection device 140 has been annotated to include a first NFET transistor 141 and a first PFET transistor 142. The first NFET transistor 141 includes a gate associated with the second p-metal gate region 146b, a source associated with the first N+ region 45a, a drain associated with the first n-well 43a, and a body associated with the left region of the p-well 42. Additionally, the first PFET transistor 142 includes a gate associated with the second p-metal gate region 146b, a source associated with the second P+ region 44b, a drain associated with the left region of the p-well 42, and a body associated with the first n-well 43a.

In the configuration shown in FIG. 11A, p-metal has been used to implement the second p-metal gate region 146b, which can increase the threshold voltage of the first NFET transistor 141 and provide lower standing leakage and help ensure that the first NFET transistor 141 does not activate during normal operating conditions of the signal pin 2. Although FIG. 7 illustrates one suitable configuration for increasing the threshold voltage of the first NFET transistor 141, other configurations are possible. For example, the NFET's threshold voltage can be increased by use of selective high k dielectric, thicker oxide formation, and/or selective channel doping.

Figure 11B:
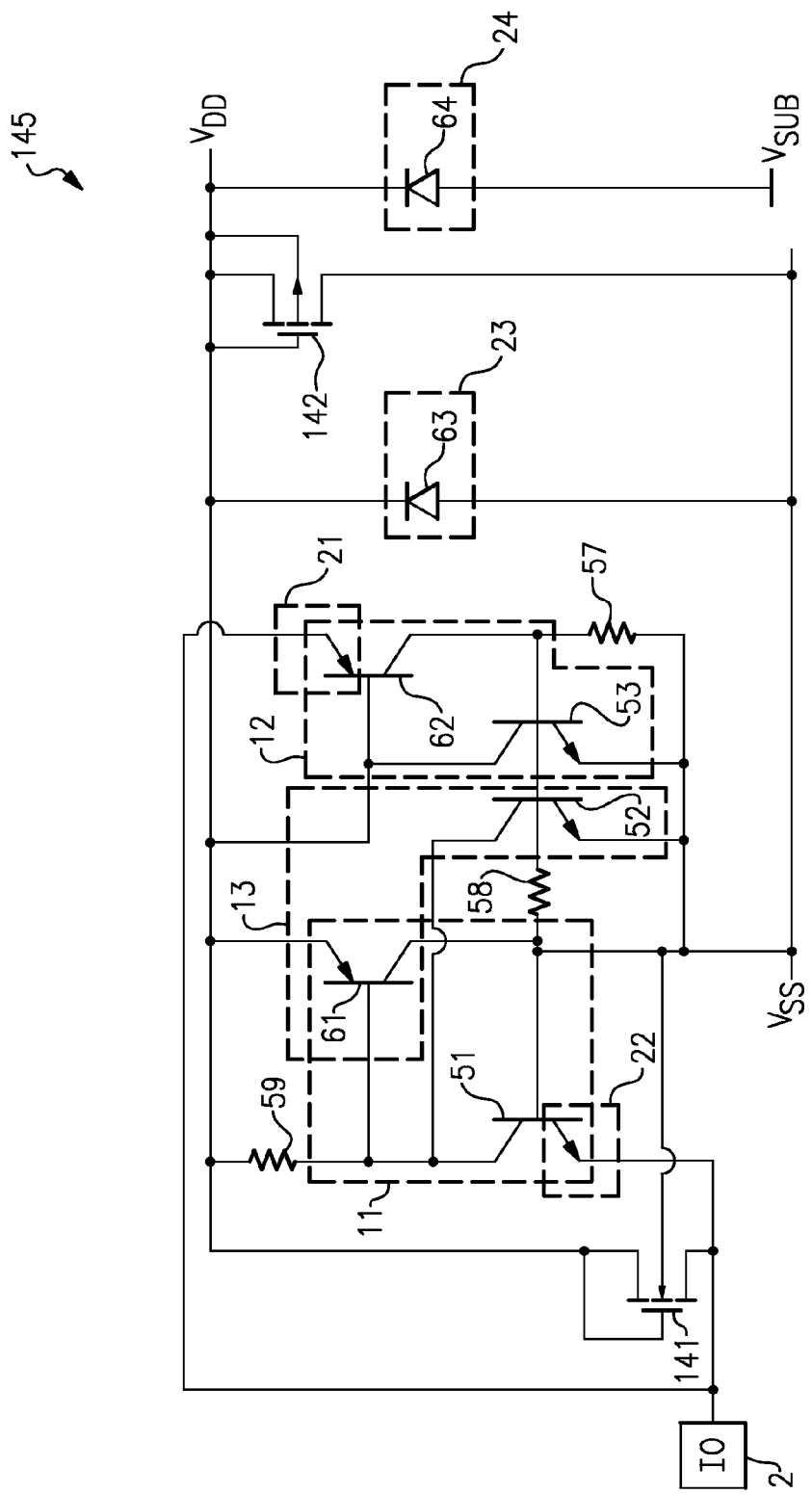
FIG. 11B is a circuit diagram of the protection device of FIG. 11A.

FIG. 11B is a circuit diagram 145 of the protection device 140 of FIG. 11A. The circuit diagram 145 of FIG. 11B is similar to the circuit diagram 50 of FIG. 3, except that the circuit diagram 145 of FIG. 11B further includes the first NFET transistor 141 and the first PFET transistor 142. As shown in FIG. 11B, the first NFET transistor 141 includes a source electrically connected to the signal pin 2, a body electrically connected to the power low supply $V_{SS}$, and a gate and drain electrically connected to the power high supply $V_{DD}$. Additionally, the first PFET transistor 142 includes a drain electrically connected to the power low supply $V_{SS}$, and a gate, source, and body electrically connected to the power high supply $V_{DD}$.

In certain implementations, the first NFET 141 is configured as a high threshold voltage device so as to reduce off-state conduction between the signal pin 2 and the power high supply $V_{DD}$ and to prevent the first NFET 141 from interfering from signals received or transmitted on the signal pin 2. Additional details of the circuit diagram 145 can be as described earlier.

Figure 12:
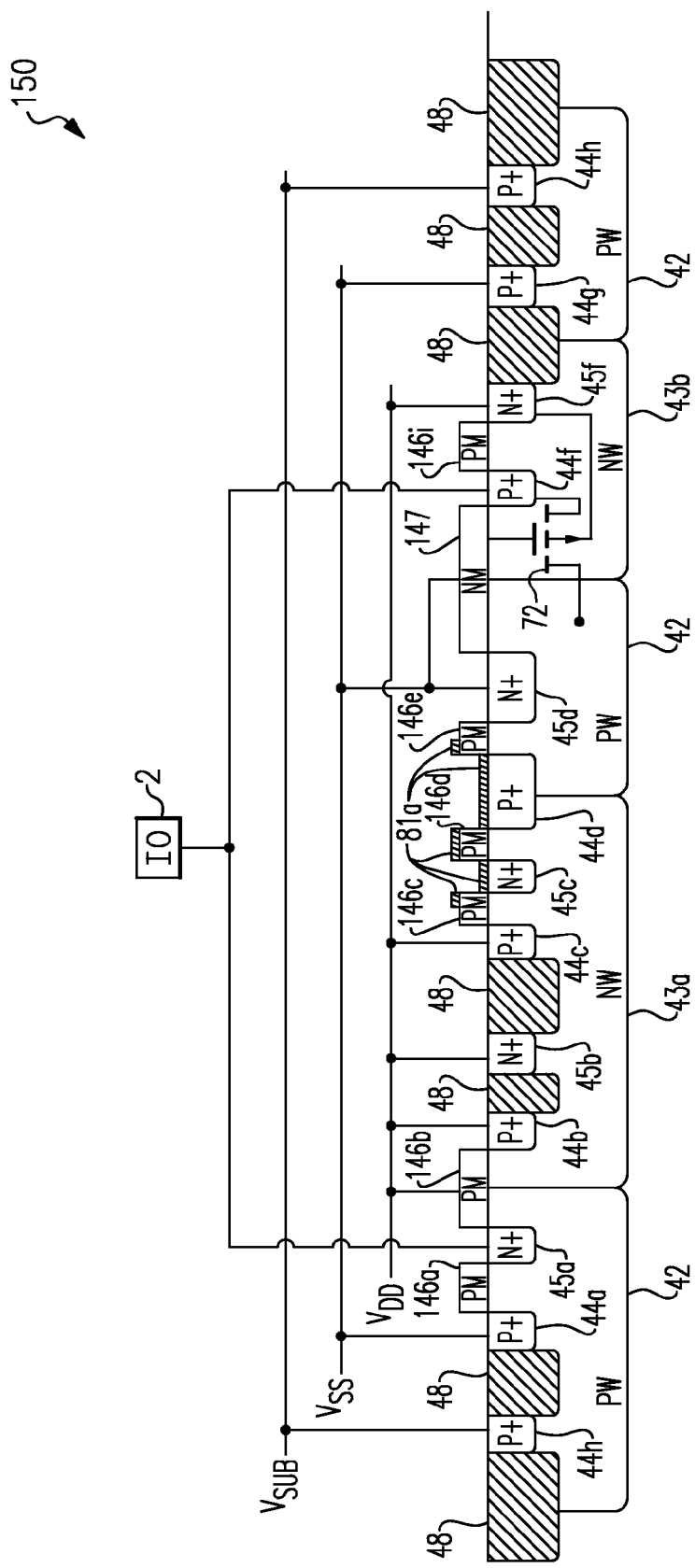
FIGS. 12-20 are cross sections of various embodiments of protection devices.

FIG. 12 is a cross section of a protection device 150 according to another embodiment. The protection device 150 of FIG. 12 is similar to the protection device 110 of FIG. 8, except that the protection device 150 of FIG. 12 implements the gate regions 46a-46e, 46i of FIG. 8 using p-metal gates 146a-146e, 146i, respectively, and implements the gate region 71 of FIG. 8 using an n-metal gate 147.

In a manner similar to that described earlier with reference to FIG. 11A, the p-metal gate 146b can increase the threshold voltage of the NFET transistor 141 of FIG. 11A. Additionally, the n-metal gate 147 can increase the threshold voltage of the PFET transistor 72 relative to a configuration using p-metal, and thus can help to further reduce the protection device's leakage current. Although using n-metal to implement the gates of PFETs and using p-metal to implement the gates of NFETs is one suitable method of increasing threshold voltage, other methods are possible. For example, an NFET's or PFET's threshold voltage can be increased by defining thicker gate regions, selective higher k dielectric formations, increasing channel length, and/or incorporating selective doping implants for threshold voltage control underneath the channel. Additional details of the protection device 150 can be similar to those described earlier.

Figure 13A:
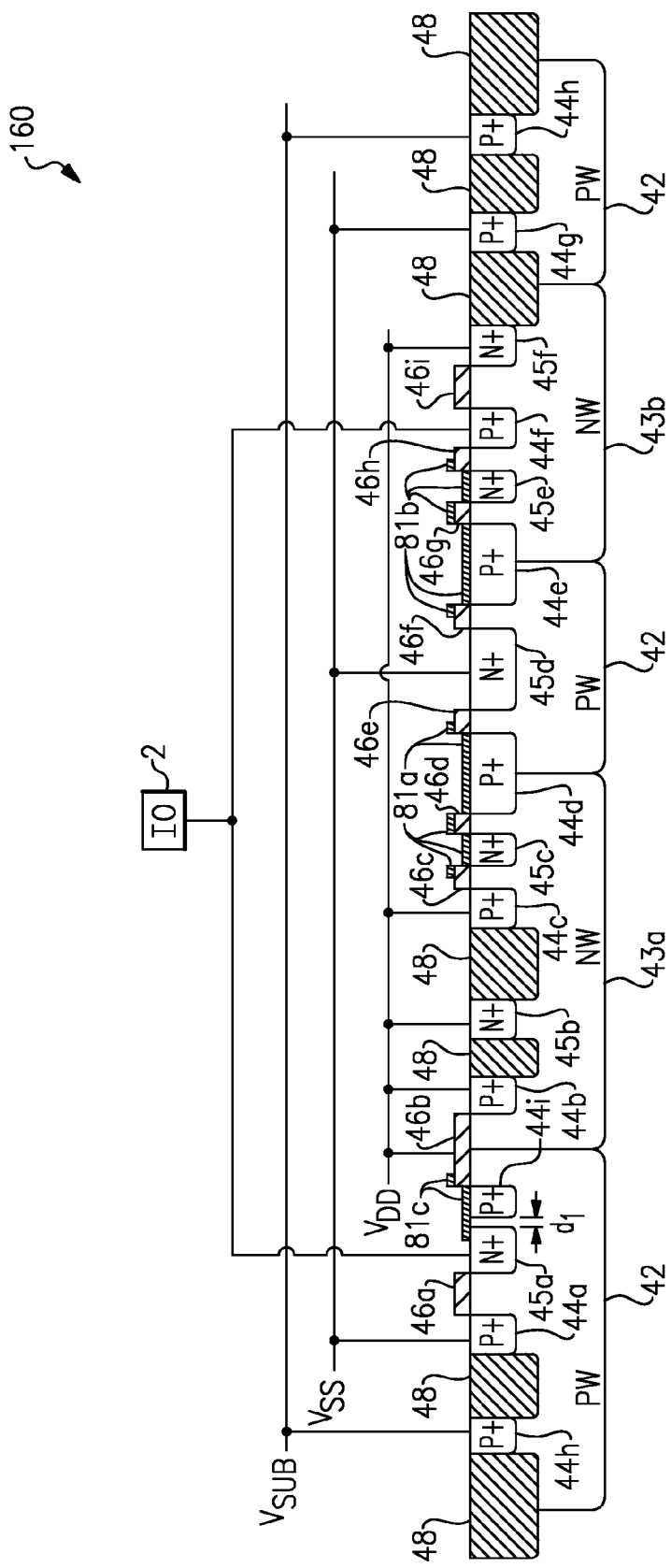

FIG. 13A is a cross section of a protection device 160 according to another embodiment. The protection device 160 of FIG. 13A is similar to the protection device 100 of FIG. 7, except that the protection device 160 further includes a ninth P+ region 44i positioned between the first N+ region 45a and the second gate region 46b. Additionally, a third RPO region 81c has been disposed over the ninth P+ region 44i, a portion of the first N+ region 45a, a portion of the second gate region 46b, and a portion of the p-well 42 between the first N+ region 45a and the ninth P+ region 44i.

The ninth P+ region 44i can aid in preventing the formation of the first NFET transistor 141 shown in FIG. 11A. Preventing the formation of the first NFET transistor 141 can be desirable in certain configurations, such as very low leakage applications and/or implementations in which a voltage difference between the power high and power low supplies $V_{DD}$, $V_{SS}$ is relatively large. Additionally, preventing the first NFET transistor's formation can be desirable when the threshold voltage of the first NFET transistor 141 is relatively low, including, for example, in configurations in which a protection device is fabricated using a manufacturing process in which p-metal is unavailable to increase the threshold voltage of the first NFET transistor 141. Additional details of the protection device 160 can be similar to those described earlier.

In the illustrated configuration, the first N+ region 45a and the ninth P+ region 44i are separated by a distance $d_1$, which can be used to control a punch-through induced breakdown voltage of the junction. In one embodiment, the distance $d_1$ is selected to be in the range of about 0.12 μm to about 0.6 μm, for instance 0.2 μm. However, other distances are possible, including, for example, distances that depending on system-level and/or processing constraints.

Figure 13B:
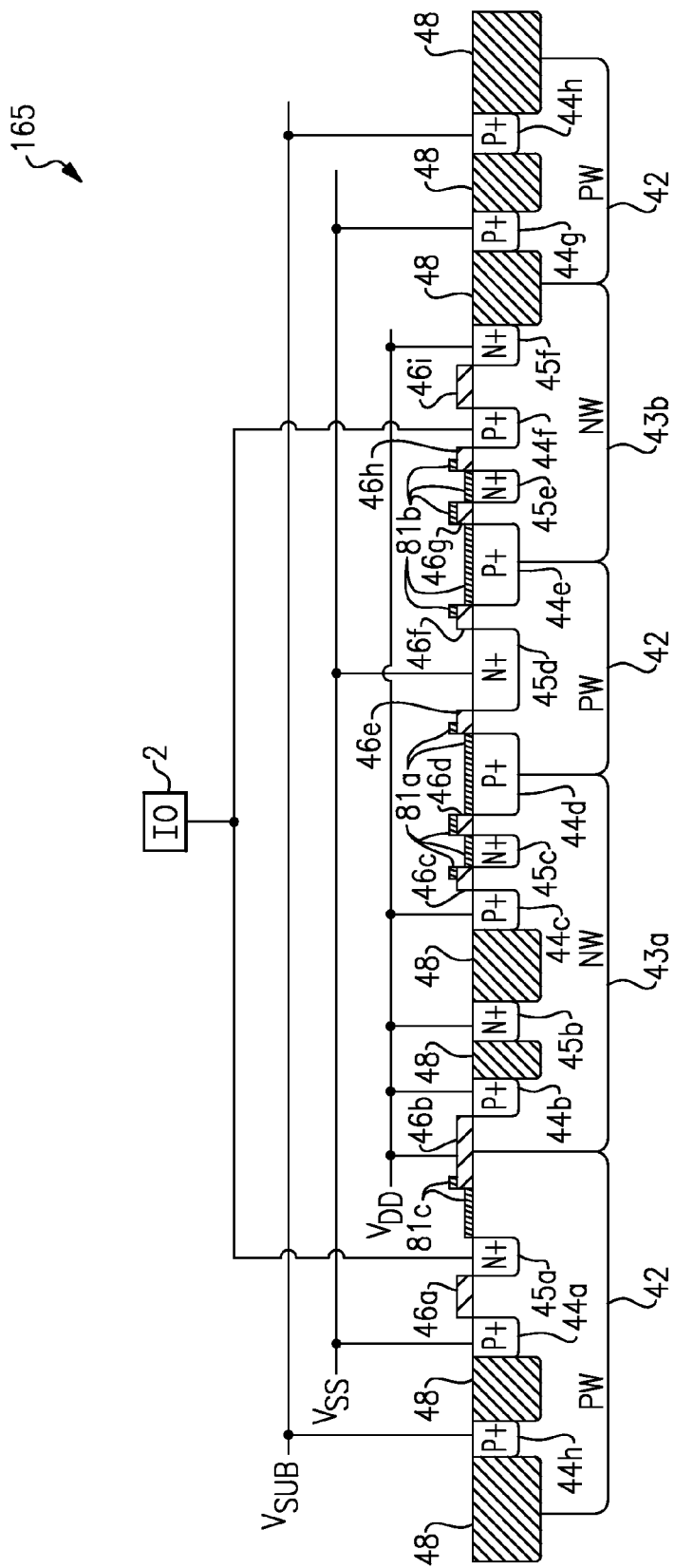

FIG. 13B is a cross section of a protection device 165 according to another embodiment. The protection device 165 of FIG. 13B is similar to the protection device 160 of FIG. 13A, except that the protection device 165 omits the ninth P+ region 44i. Additionally, the first N+ region 45a has been implemented such that the first N+ region 45a is spaced apart from the second gate region 46b and such that the first N+ region 45a does not extend beneath the third RPO region 81c.

Configuring the first N+ region 45a in this manner can increase the first N+ region's breakdown voltage relative to the configuration shown in FIG. 13A. For example, in certain processes, the protection device 160 of FIG. 13A can have a relatively low breakdown voltage between the first N+ region 45a and the ninth P+ region 44i, since such regions can be relatively highly doped. Additional details of the protection device 165 can be similar to those described earlier.

Figure 14A:
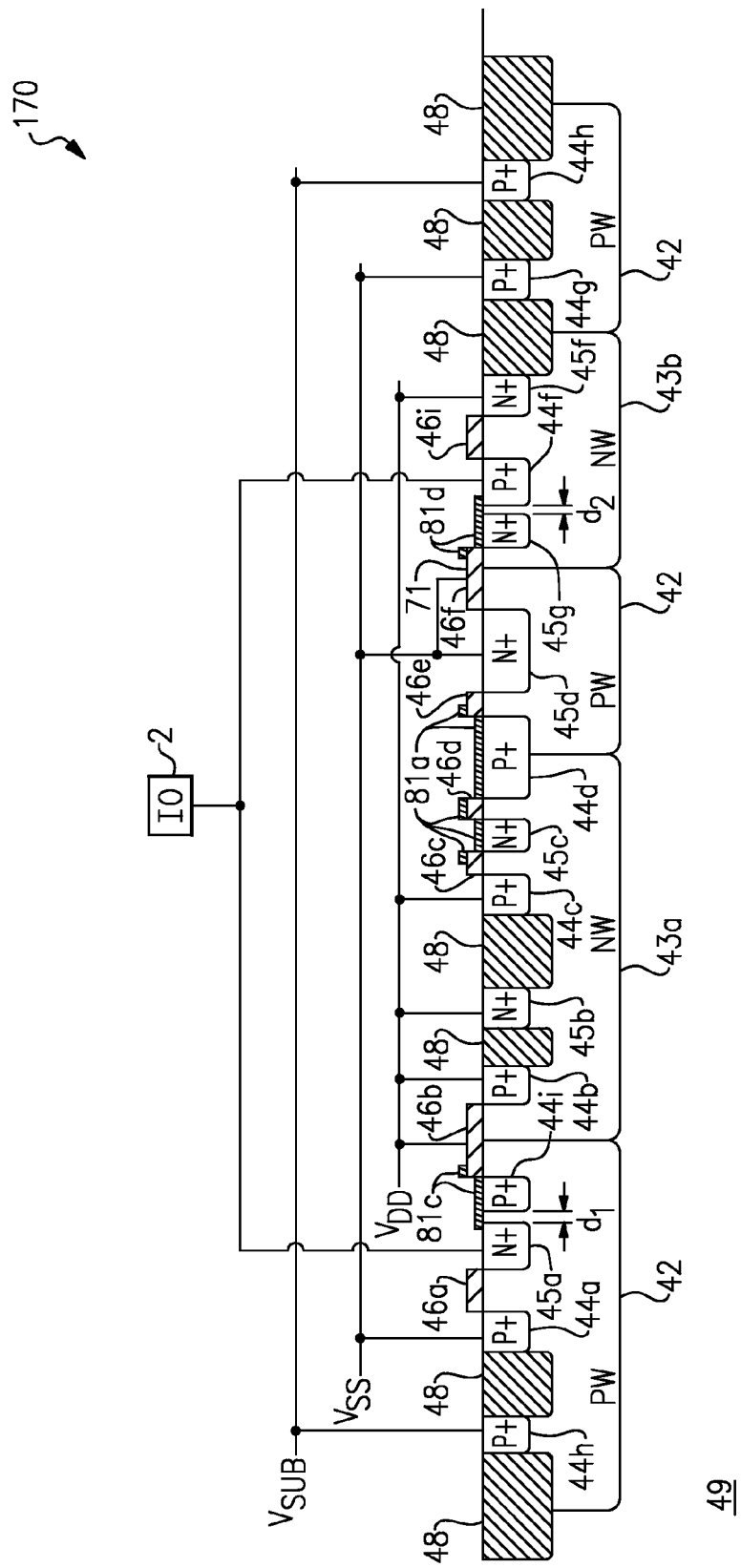

FIG. 14A is a cross section of a protection device 170 according to another embodiment. The protection device 170 of FIG. 14A is similar to the protection device 110 of FIG. 8, except that the protection device 170 further includes the ninth P+ region 44i and the third RPO region 81c, which can be as described earlier. Additionally, the protection device 170 further includes a seventh N+ region 45g and a fourth a RPO region 81d. The seventh N+ region 45g is positioned between the sixth P+ region 44f and the gate region 71. The fourth RPO region 81d is disposed over the seventh N+ region 45g, a portion of the gate region 71, and a portion of the sixth P+ region 44f, and a portion of the second n-well 43b between the seventh N+ region 45g and the sixth P+ region 44f.

The seventh N+ region 45g can prevent the formation of the PFET transistor 72 shown in FIG. 4B, which can be desirable in certain configurations, such as low leakage configurations. In the illustrated configuration, the seventh N+ region 45g and the sixth P+ region 44f are separated by a distance $d_2$, which can be selected to control a punch-through induced breakdown voltage of the junction. In one embodiment, the distance $d_2$ is selected to be in the range of about 0.12 μm to about 0.6 μm, for instance 0.2 μm. However, other distances are possible, including, for example, distances that depending on system-level and/or processing constraints. Additional details of the protection device 170 can be similar to those described earlier.

Figure 14B:
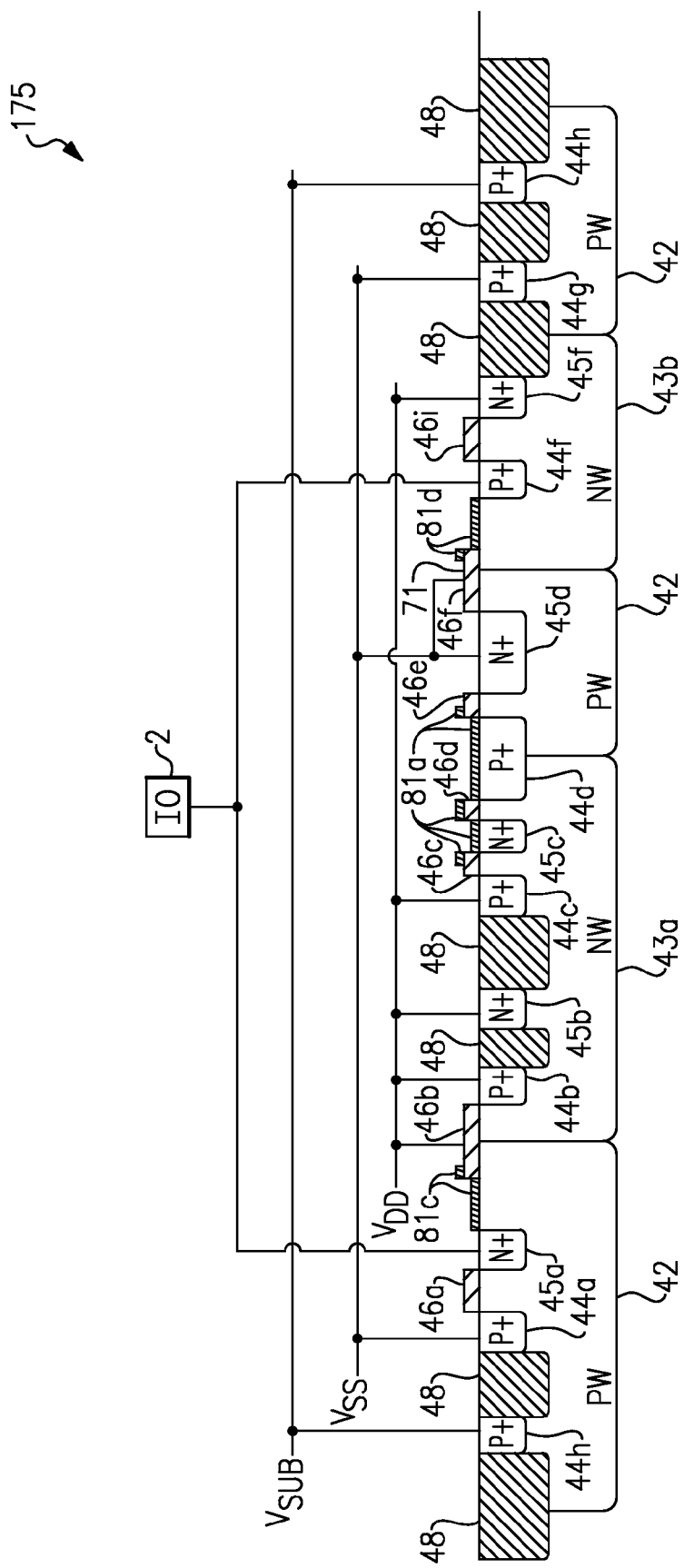

FIG. 14B is a cross section of a protection device 175 according to another embodiment. The protection device 175 of FIG. 14B is similar to the protection device 170 of FIG. 14A, except that the protection device 175 omits the ninth P+ region 44i and the seventh N+ region 45g. Additionally, the first N+ region 45a has been implemented such that the first N+ region 45a is spaced apart from the second gate region 46b and such that the first N+ region 45a does not extend beneath the third RPO region 81c. Furthermore, the sixth P+ region 44f has been implemented such that the sixth P+ region 44f is spaced apart from the gate region 71 and such that the sixth P+ region 44f does not extend beneath the fourth RPO region 81d.

Configuring the first N+ region 45a in this manner can increase the first N+ region's breakdown voltage relative to the configuration shown in FIG. 14A and avoid NMOS formation to reduce standing leakage. For example, the gate region 46b of FIG. 14B does not include n-type regions on opposing sides of the gate region 46b, and thus does not include an associated NMOS transistor. Preventing the formation of the NMOS transistor can be useful in a variety of configurations, such as very low standing IO leakage implementations and/or configurations using manufacturing processes in which a high threshold voltage option for the NMOS transistor is limited or unavailable.

Additionally, configuring the sixth P+ region 44f in this manner can increase the sixth P+ region's breakdown voltage relative to the configuration shown in FIG. 14A and avoid PMOS formation to reduce standing leakage. For example, the gate region 71 of FIG. 14B does not include p-type regions on opposing sides of the gate region 71, and thus does not include an associated PMOS transistor. Preventing the formation of the PMOS transistor can be useful in a variety of configurations, such as very low standing IO leakage implementations and/or configurations using manufacturing processes in which a high threshold voltage option for the PMOS transistor is limited or unavailable. Additional details of the protection device 175 can be similar to those described earlier.

Figure 15:
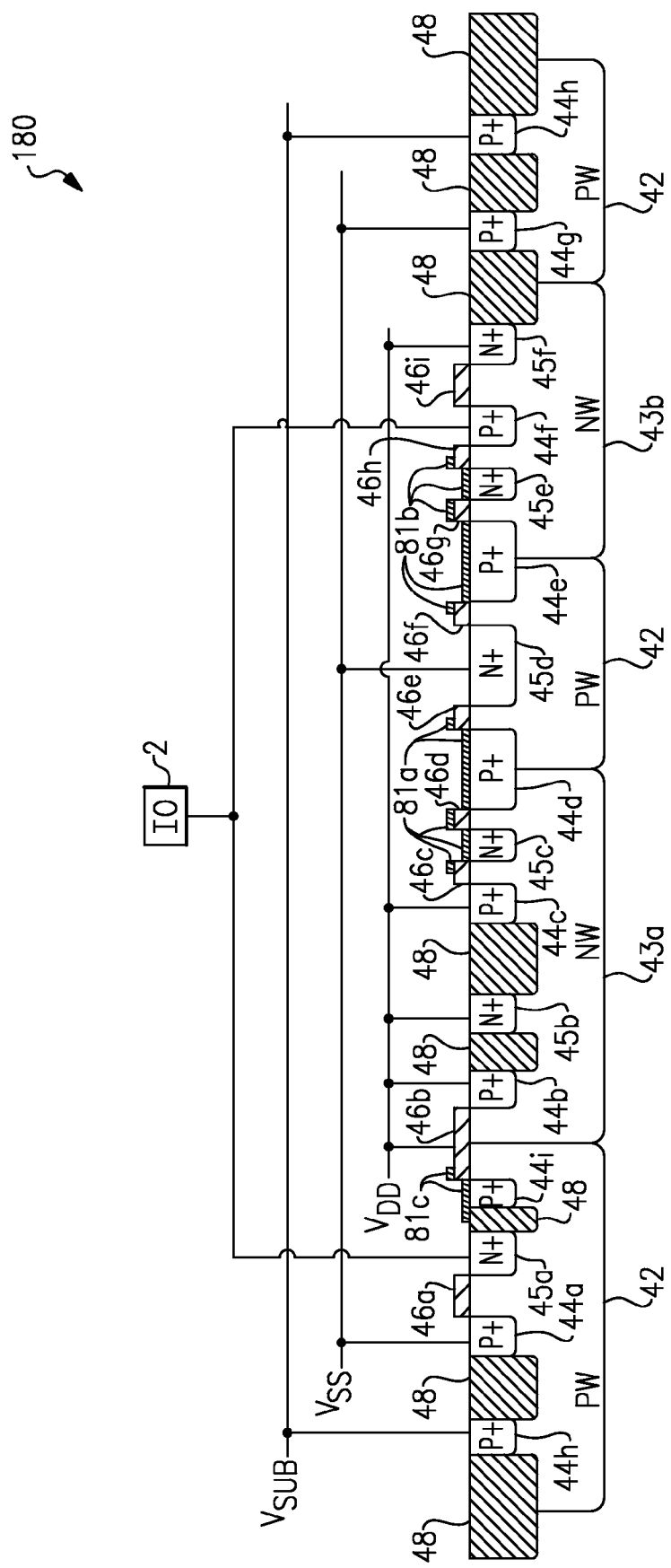

FIG. 15 is a cross section of a protection device 180 according to another embodiment. The protection device 180 of FIG. 15 is similar to the protection device 160 of FIG. 13A, except that the protection device 180 further includes an oxide region 48 positioned between the first N+ region 45a and the ninth P+ region 44i. Configuring the protection device 180 in this manner can reduce the protection device's off-state power consumption by reducing the flow of leakage current between the first N+ region 45a and the ninth P+ region 44i. Additional details of the protection device 180 can be similar to those described earlier.

Figure 16:
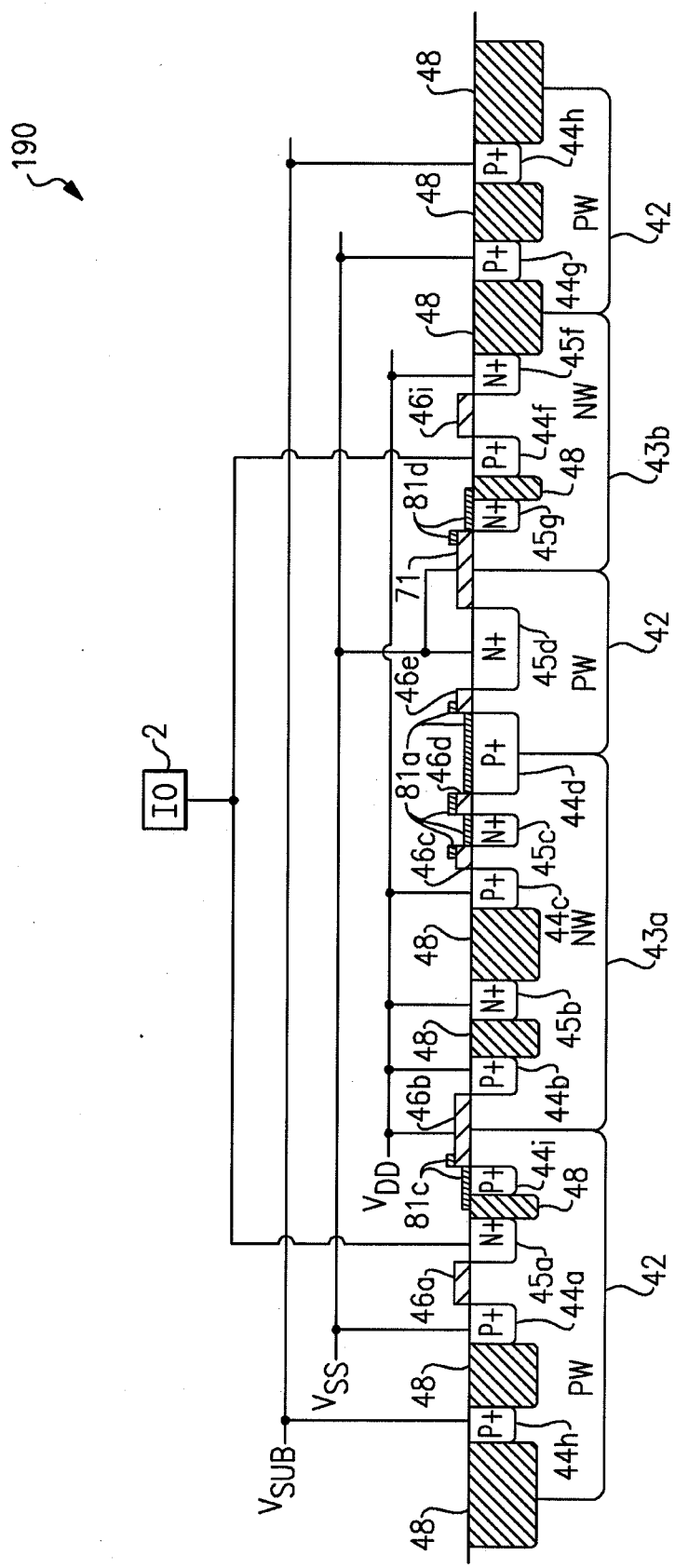

FIG. 16 is a cross section of a protection device 190 according to another embodiment. The protection device 190 of FIG. 16 is similar to the protection device 170 of FIG. 14A, except that the protection device 190 further includes oxide regions 48 positioned between the first N+ region 45a and the ninth P+ region 44i and between the seventh N+ region 45g and the sixth P+ region 44f. Configuring the protection device 190 in this manner can reduce the protection device's leakage current. Additional details of the protection device 190 can be similar to those described earlier.

Figure 17:
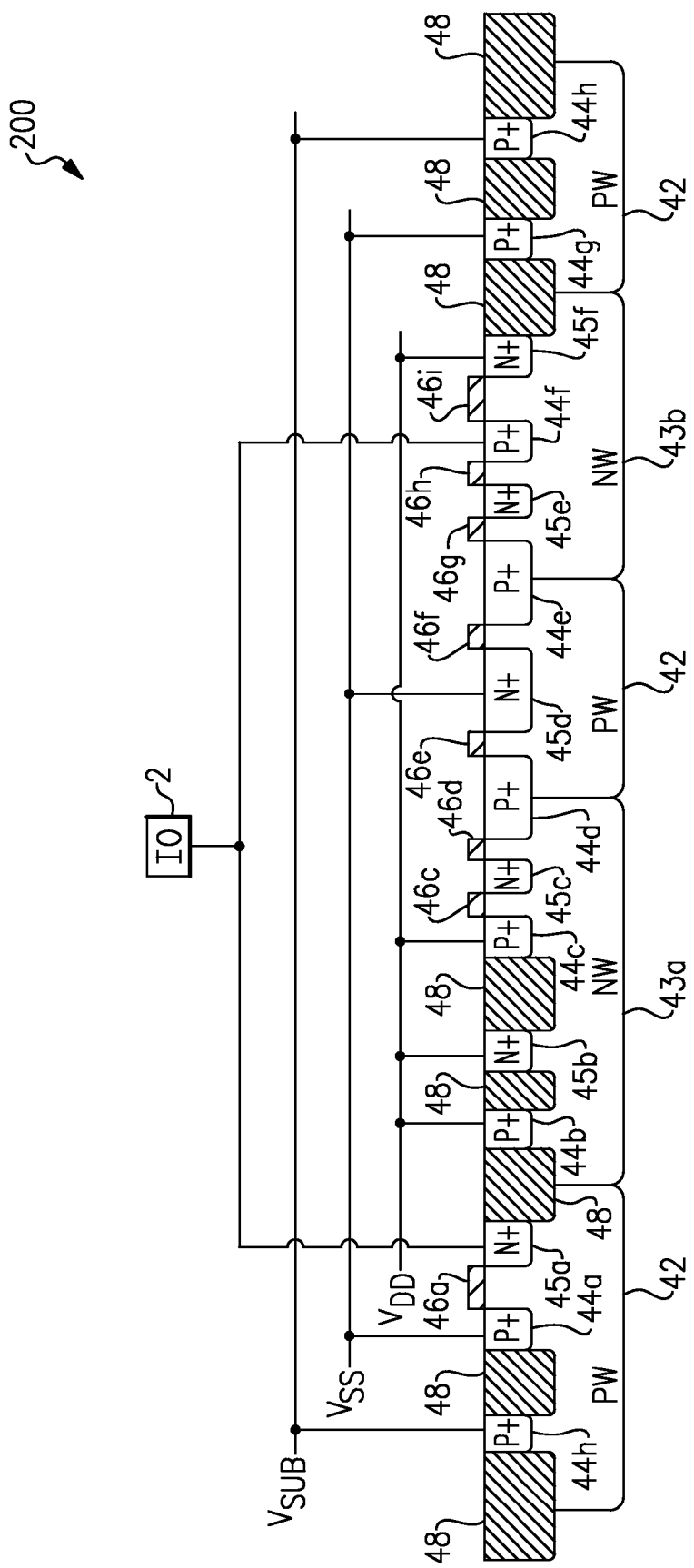

FIG. 17 is a cross section of a protection device 200 according to another embodiment. The protection device 200 of FIG. 17 is similar to the protection device 40 of FIGS. 2A-2C, except that the protection device 200 illustrates a configuration in which the second gate region 46b is omitted in favor of including an oxide region 48 between the first N+ region 45a and the second P+ region 44b.

Including the oxide region 48 between the first N+ region 45a and the second P+ region 44b can prevent the formation of the first NFET transistor 141 and the first PFET transistor 142 shown in FIG. 11A, which can be desirable in certain configurations, such as low leakage configurations at higher operating voltage conditions. Additional details of the protection device 200 can be similar to those described earlier.

Figure 18:
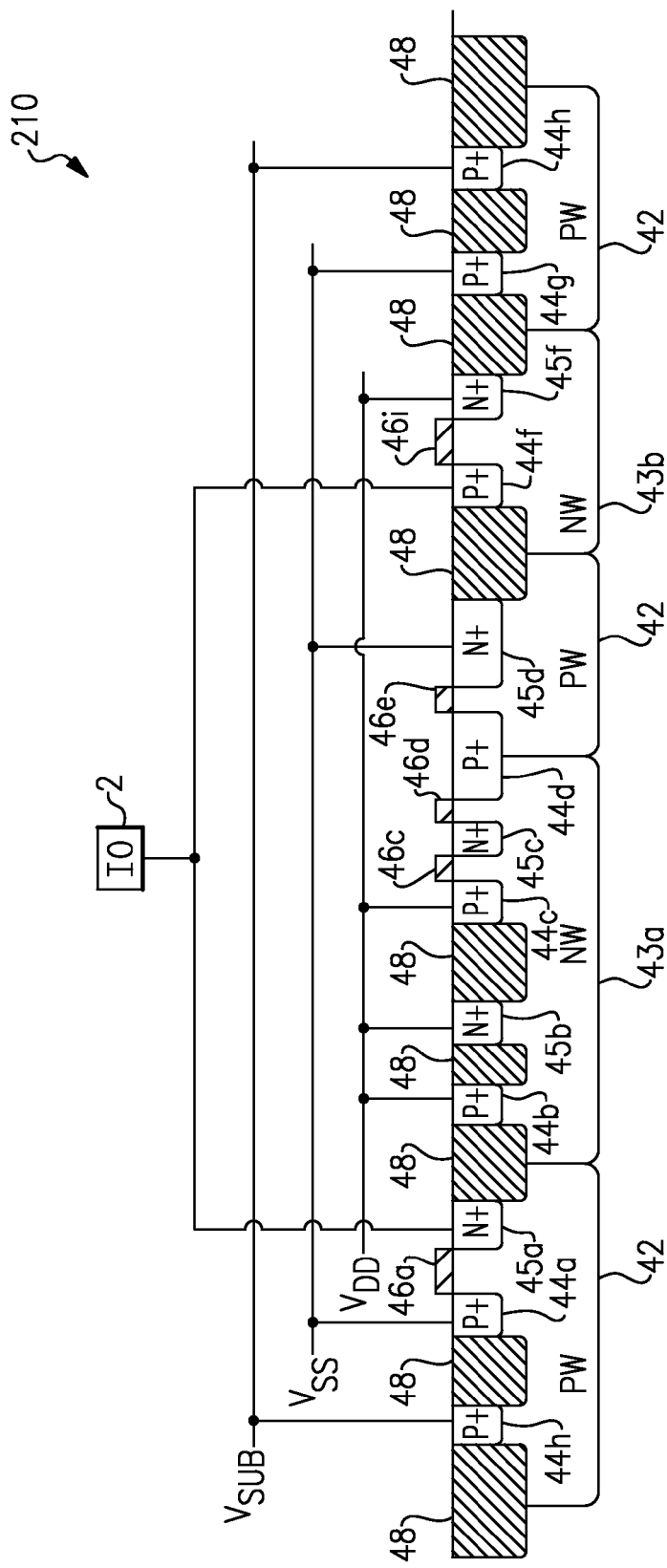

FIG. 18 is a cross section of a protection device 210 according to another embodiment. The protection device 210 of FIG. 18 is similar to the protection device 70 of FIGS. 4A-4B, except that the protection device 200 illustrates a configuration in which both the gate region 46b and the gate region 71 are omitted in favor of including oxide regions 48 between the first N+ region 45a and the second P+ region 44b and between the fourth N+ region 45d and the sixth P+ region 44f.

Including the oxide region 48 between the first N+ region 45a and the second P+ region 44b can prevent the formation of the first NFET transistor 141 and the first PFET transistor 142 shown in FIG. 11A. Additionally, including the oxide region 48 between the fourth N+ region 45d and the sixth P+ region 44f can prevent the formation of the PFET transistor 72 of FIG. 4B. Additional details of the protection device 210 can be similar to those described earlier.

Figure 19:
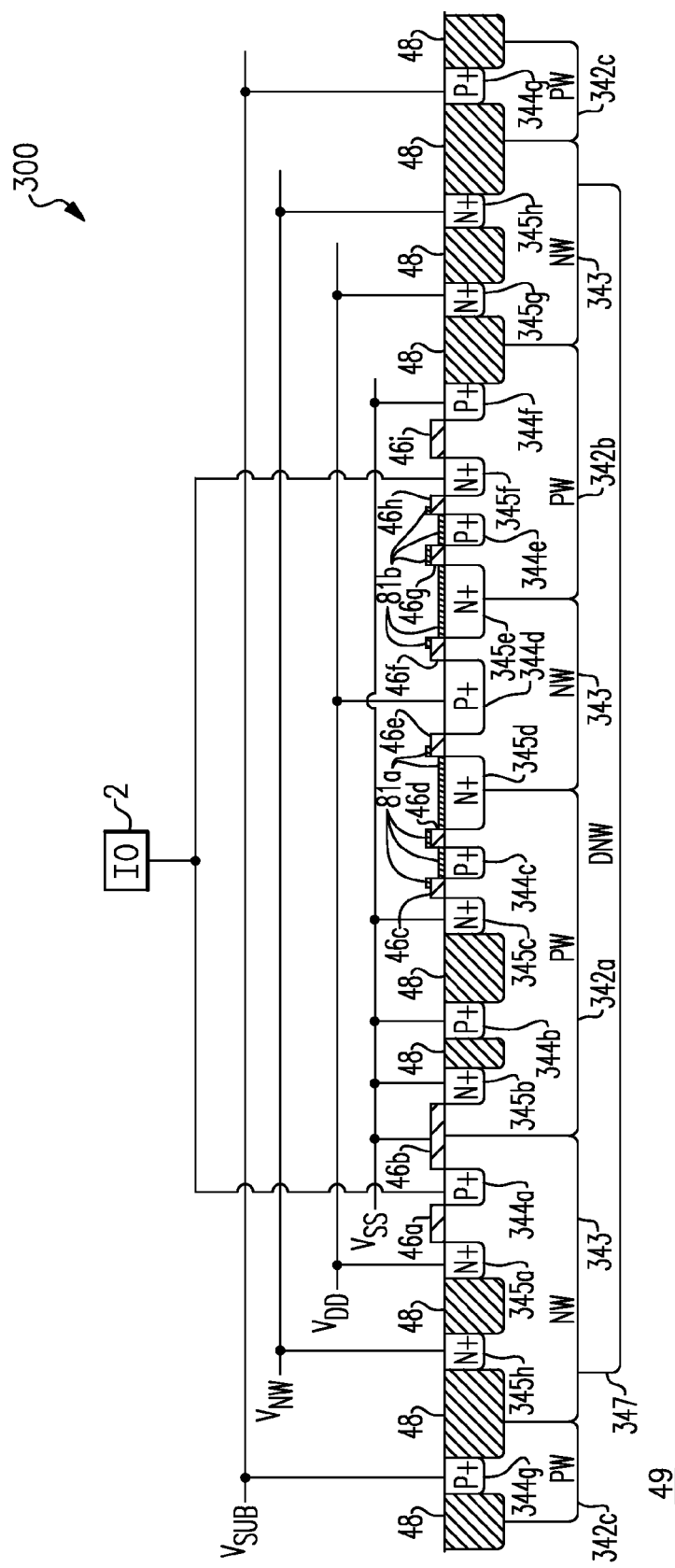

FIG. 19 is a cross section of a protection device 300 according to another embodiment. The protection device 300 includes an n-well 343, first to third p-wells 342a-342c, first to eighth N+ regions 345a-345h, first to seventh P+ regions 344a-344g, first to ninth gate regions 46a-46i, first and second RPO regions 81a, 81b, and a deep n-well 347. The protection device 300 is fabricated in the p-type substrate 49.

The protection device 300 of FIG. 19 is similar to the protection device 100 of FIG. 7, except that the doping of the wells and diffusion regions has been reversed so as to provide a protection device of a complementary polarity. For example, the n-well 343 of FIG. 19 can correspond to the p-well 42 of FIG. 7 but with polarity reversed, and the first and second p-wells 342a, 342b of FIG. 19 can correspond to the first and second n-wells 43a, 43b of FIG. 7, respectively, but with polarity reversed. Similarly, the first to eighth N+ regions 345a-345h of FIG. 19 can correspond to the first to eighth P+ regions 44a-44h of FIG. 7, respectively, but with polarity reversed. Likewise, the first to sixth P+ regions 344a-344f of FIG. 19 can correspond to the first to sixth N+ regions 45a-45f of FIG. 7, respectively, but with polarity reversed.

Relative to the protection device 100 of FIG. 7, the protection device 300 of FIG. 19 further includes the seventh P+ region 344g, the third p-well 342c, and the deep n-well 347. The seventh P+ region 344g and the third p-well 342c can be configured to surround a perimeter of the protection device 300, and can operate as a guard ring to reduce carrier injection into the p-type substrate 49 during an ESD event. The deep n-well 347 has been positioned beneath the n-well 343 and the first and second p-wells 342a, 342b, and can be used to electrically isolate the first and second p-wells 342a, 342b from the p-type substrate 49. Additional details of the protection device 300 can be similar to those described earlier.

To maintain proper junction biasing, the electrical connections between the protection device 300 of FIG. 19 and the power high and low supplies $V_{DD}$, $V_{SS}$ has been reversed relative to the configuration of FIG. 7. For example, as shown in FIG. 19, the second gate region 46b, the second N+ region 345b, the second P+ region 344b, the third N+ region 345c, and the sixth P+ region 344f are electrically connected to the power low supply $V_{SS}$. Additionally, the first N+ region 345a, the fourth P+ region 344d, and the seventh N+ region 345g are electrically connected to the power high supply $V_{DD}$. Furthermore, the eighth N+ region 345h is electrically connected to an n-well supply $V_{NW}$, which can be Kelvin-connected to a power high supply pin in certain configurations. The first P+ region 344a and the sixth N+ region 345f are electrically connected to the signal pin 2, and the seventh P+ region 344g is electrically connected to the substrate supply $V_{SUB}$. The first gate region 46a and the third to ninth gate regions 46c-46i are electrically floating.

Although FIG. 19 illustrates a complementary configuration of the protection device 100 of FIG. 7, any of the protection devices described herein can be implemented in a complementary configuration including the DNW as described in FIG. 19.

Figure 20:
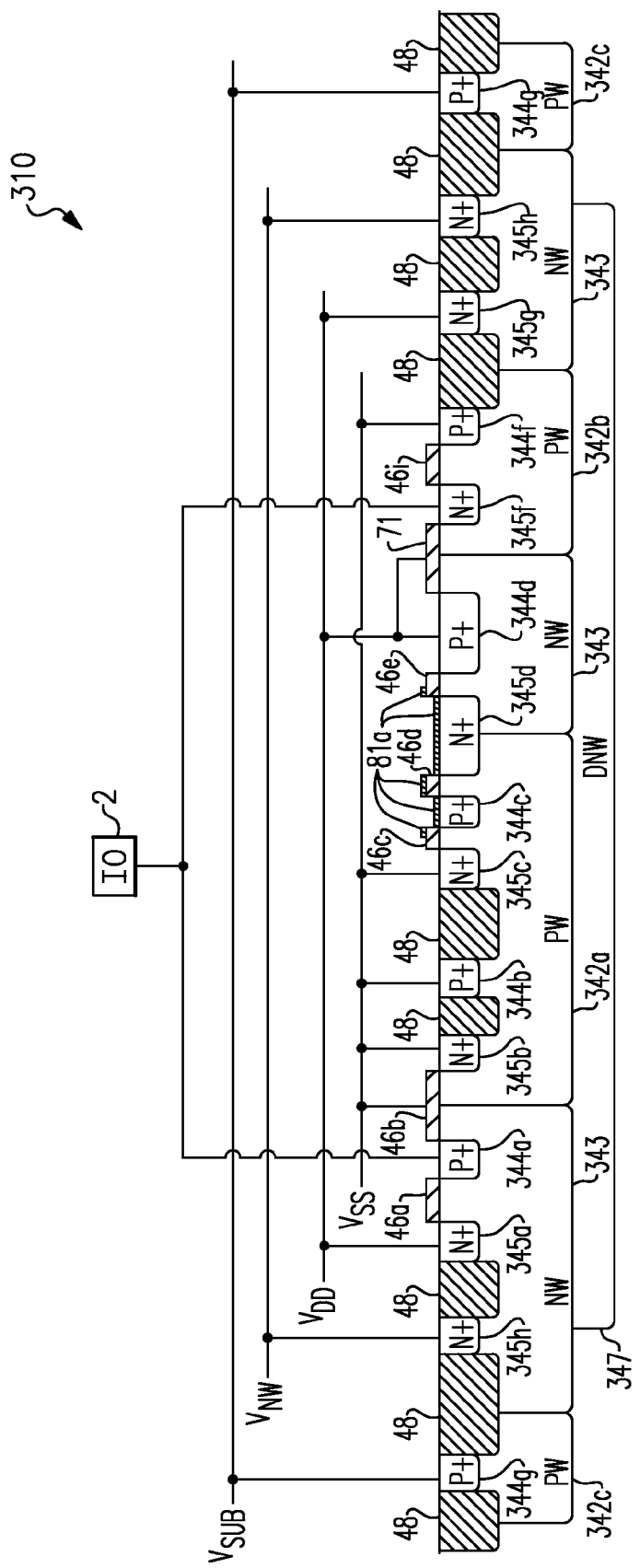

FIG. 20 is a cross section of a protection device 310 according to another embodiment.

The protection device 310 of FIG. 20 is similar to the protection device 300 of FIG. 19, except that the protection device 310 of FIG. 20 illustrates a configuration in which the fifth N+ region 345e and fifth P+ region 344e have been omitted. Additionally, the sixth to eighth gate regions 46f-46h have been omitted in favor of using the gate region 71, which extends over the n-well 343 and the second p-well 342b between the fourth P+ region 344d and the sixth N+ region 345f. As shown in FIG. 20, the gate region 71 is electrically connected to the power high supply $V_{DD}$.

The protection device 310 of FIG. 20 illustrates a complementary implementation of the protection device 110 of FIG. 8. Additional details of the protection device 310 can be similar to those described earlier.

APPLICATIONS

Devices employing the above described schemes can be implemented into various high performance electronic devices and interface applications operating in harsh electrical environments. Examples of the electronic devices can include, but are not limited to, consumer electronic products, parts of the consumer electronic products, electronic test equipment, high robustness industrial and automotive applications, etc. Examples of the electronic devices can also include circuits of optical networks or other communication networks. The consumer electronic products can include, but are not limited to, an automobile, an engine control unit, a vehicle engine management controller, a transmission controller, a seatbelt controller, an anti-lock brake system controller, a camcorder, a camera, a digital camera, a portable memory chip, a washer, a dryer, a washer/dryer, a copier, a facsimile machine, a scanner, a multi functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
a substrate;
a first well region of a first type in the substrate;
a second well region of the first type in the substrate adjacent the first well region;
a third well region of a second type opposite the first type, wherein the third well region is positioned in the substrate between the first and second well regions;
a fourth well region of the second type positioned on a side of the first well region that is opposite the third well region;
a fifth well region of the second type positioned in the substrate on a side of the second well region that is opposite the third well region;
a first diffusion region of the first type in the fourth well region;
a second diffusion region of the second type in the first well region;
a third diffusion region of the first type in the third well region; and
a fourth diffusion region of the second type in the second well region;
wherein the first diffusion region, the fourth well region, the first well region, and the second diffusion region are configured to operate as a first thyristor structure;
wherein the third diffusion region, the third well region, the second well region, and the fourth diffusion region are configured to operate as a second thyristor structure;
wherein the second diffusion region, the first well region, the third well region and the third diffusion region are configured to operate as a third thyristor structure;
wherein a junction between the second well region and the fourth diffusion region is configured to operate as a first diode structure;
wherein a junction between the fourth well region and the first diffusion region is configured to operate as a second diode structure; and wherein a junction between the fifth well region and the second well region is configured to operate as a third diode structure.

2. The apparatus of claim 1, further comprising:
a first signal pin, wherein the first and fourth diffusion regions are electrically connected to the first signal pin;
a first power supply pin, wherein the second diffusion region is electrically connected to the first power supply pin; and
a second power supply pin, wherein the third diffusion region is electrically connected to the second power supply pin.

3. The apparatus of claim 2, further comprising:
a fifth diffusion region of the second type in the fourth well region, wherein the first diffusion region is positioned between the second diffusion region and the fifth diffusion region; and
a sixth diffusion region of the second type in the fifth well region, wherein the fifth and sixth diffusion regions are electrically connected to the second power supply pin.

4. The apparatus of claim 3, further comprising:
a seventh diffusion region of the second type in the first well region, wherein the seventh diffusion region is positioned between the second and third diffusion regions; and
an eighth diffusion region of the first type in the fourth well region, wherein the eighth diffusion region is positioned between the fourth and sixth diffusion regions;
wherein the seventh and eighth diffusion regions are electrically connected to the first power supply pin.

5. The apparatus of claim 3, wherein the first type is n-type and the second type is p-type.

6. The apparatus of claim 3, wherein the first type is p-type and the second type is n-type, the apparatus further comprising:
a deep well region of the second type disposed beneath the first well region, the second well region, the third well region, and at least a portion of the fourth and fifth well regions.

7. The apparatus of claim 4, further comprising:
a first gate region over a portion of the second well region and over a portion of the third well region, wherein the first gate region is positioned between the third and fourth diffusion regions.

8. The apparatus of claim 4, further comprising:
a first gate region over a portion of the first well region and over a portion of the fourth well region, wherein the first gate region is positioned between the first and second diffusion regions.

9. The apparatus of claim 8, further comprising:
a first metal oxide semiconductor transistor and a second metal oxide semiconductor transistor, wherein the first metal oxide semiconductor transistor has a p-type channel and a first type of gate metal structure, wherein the second metal oxide semiconductor transistor has an n-type channel and a second type of gate metal structure different from the first type of gate metal structure;
wherein the first gate region comprises the first type of gate metal structure.

10. The apparatus of claim 8, further comprising:
a ninth diffusion region of the second type in the third well region, wherein the ninth diffusion region is positioned between the first diffusion region and the first gate region.

11. The apparatus of claim 10, further comprising:
a resist protective oxide (RPO) region over at least the ninth diffusion region.

12. The apparatus of claim 11, further comprising:
an oxide region between the ninth diffusion region and the first diffusion region.

13. The apparatus of claim 11, wherein the ninth diffusion region is spaced apart from the first diffusion region such that a portion of the fourth well region is between the ninth diffusion region and the first diffusion region.

14. The apparatus of claim 7, further comprising:
a ninth diffusion region of the first type in the second well region, wherein the ninth diffusion region is positioned between the fourth diffusion region and the first gate region.

15. The apparatus of claim 7, further comprising:
a resist protective oxide (RPO) region over a portion of the second well region between the fourth diffusion region and the first gate region, wherein the fourth diffusion region does not extend beneath the RPO region.

16. The apparatus of claim 7, further comprising:
a first metal oxide semiconductor transistor and a second metal oxide semiconductor transistor, wherein the first metal oxide semiconductor transistor has a p-type channel and a first type of gate metal structure, wherein the second metal oxide semiconductor transistor has an n-type channel and a second type of gate metal structure different from the first type of gate metal structure;
wherein the first gate region comprises the second type of gate metal structure.

17. The apparatus of claim 14, further comprising:
a resist protective oxide (RPO) region over at least the ninth diffusion region.

18. The apparatus of claim 17, further comprising:
an oxide region between the ninth diffusion region and the fourth diffusion region.

19. The apparatus of claim 17, wherein the ninth diffusion region is spaced apart from the fourth diffusion region such that a portion of the second well region is between the ninth diffusion region and the fourth diffusion region.

* * * * *